(12) United States Patent
Saito et al.

(10) Patent No.: US 9,461,197 B2
(45) Date of Patent: Oct. 4, 2016

(54) LIGHT-EMITTING ELEMENT WAFER, LIGHT EMITTING ELEMENT, ELECTRONIC APPARATUS, AND METHOD OF PRODUCING LIGHT-EMITTING ELEMENT WAFER

(71) Applicant: Sony Corporation, Tokyo (JP)

(72) Inventors: Daisuke Saito, Tokyo (JP); Hiroki Naito, Kanagawa (JP); Takahiro Koyama, Kanagawa (JP); Sayaka Aoki, Kanagawa (JP); Arata Kobayashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 5 days.

(21) Appl. No.: 14/294,264

(22) Filed: Jun. 3, 2014

(65) Prior Publication Data
US 2014/0361321 A1 Dec. 11, 2014

(30) Foreign Application Priority Data
Jun. 10, 2013 (JP) .................. 2013-121462

(51) Int. Cl.
*H01L 33/00* (2010.01)
*H01L 33/44* (2010.01)
*H01L 33/46* (2010.01)
*H01L 33/30* (2010.01)
*H01L 27/15* (2006.01)
*H01L 33/20* (2010.01)

(52) U.S. Cl.
CPC ............. *H01L 33/005* (2013.01); *H01L 33/44* (2013.01); *H01L 33/46* (2013.01); *H01L 27/156* (2013.01); *H01L 33/0079* (2013.01); *H01L 33/0095* (2013.01); *H01L 33/20* (2013.01); *H01L 33/30* (2013.01)

(58) Field of Classification Search
CPC ..... H01L 33/005; H01L 33/22; H01L 33/46; H01L 33/10; H01L 33/60; H01L 33/405; H01L 33/50; H01L 27/15
See application file for complete search history.

(56) References Cited

U.S. PATENT DOCUMENTS

| 2002/0134987 | A1* | 9/2002 | Takaoka .......................... 257/98 |
| 2006/0138432 | A1* | 6/2006 | Yoon et al. ..................... 257/79 |
| 2006/0175621 | A1* | 8/2006 | Ohtsuka et al. ................ 257/88 |
| 2006/0273336 | A1* | 12/2006 | Fujikura et al. ................ 257/98 |

(Continued)

FOREIGN PATENT DOCUMENTS

JP  2008-172040  7/2008

*Primary Examiner* — Tucker J Wright
(74) *Attorney, Agent, or Firm* — Dentons US LLP

(57) ABSTRACT

A light-emitting element wafer includes a supporting substrate, a luminescent layer that is formed of a semiconductor and has a first surface and a second surface, the first surface including a first electrode, the second surface including a second electrode, the second surface being arranged between the supporting substrate and the first surface, a junction layer that joins luminescent layer to the supporting substrate and is arranged between the supporting substrate and the second surface, a first inorganic film formed on the first surface, a second inorganic film formed between the junction layer and the second surface, an isolation trench portion that isolates elements and is formed to have a depth such that the isolation trench portion extends from the first inorganic film to the supporting substrate, and a third inorganic film that connects the first inorganic film and the second inorganic film.

10 Claims, 23 Drawing Sheets

(56) References Cited

U.S. PATENT DOCUMENTS

| | | |
|---|---|---|
| 2007/0176188 A1* | 8/2007 | Tanaka et al. .................. 257/88 |
| 2008/0035949 A1* | 2/2008 | Fudeta et al. .................. 257/99 |
| 2008/0048202 A1* | 2/2008 | Tazima et al. .................. 257/98 |
| 2008/0237629 A1* | 10/2008 | Ando et al. .................. 257/103 |
| 2009/0289273 A1* | 11/2009 | Tsai et al. ....................... 257/98 |
| 2009/0315054 A1* | 12/2009 | Kim et al. ...................... 257/98 |
| 2011/0127549 A1* | 6/2011 | Lee et al. ........................ 257/88 |
| 2011/0220937 A1* | 9/2011 | Jeong et al. .................... 257/98 |
| 2014/0217457 A1* | 8/2014 | Cho et al. ....................... 257/99 |

* cited by examiner

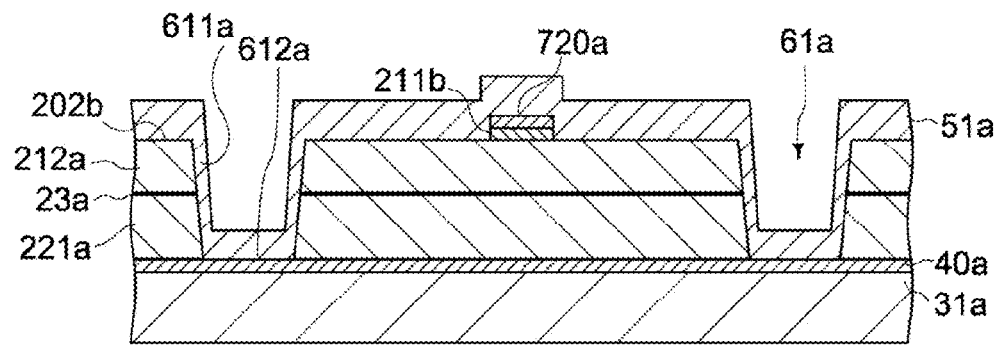
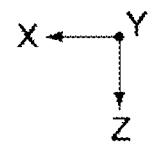
FIG.13A
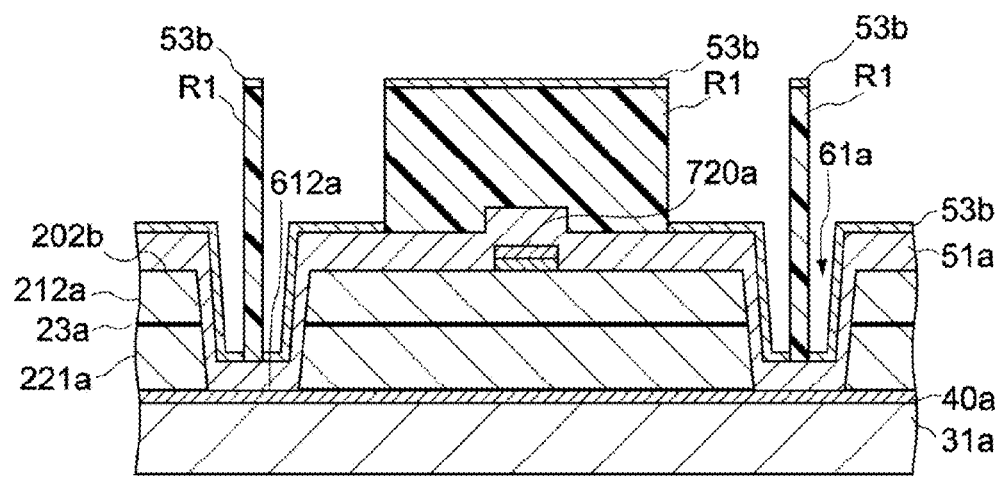
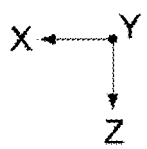
FIG.13B

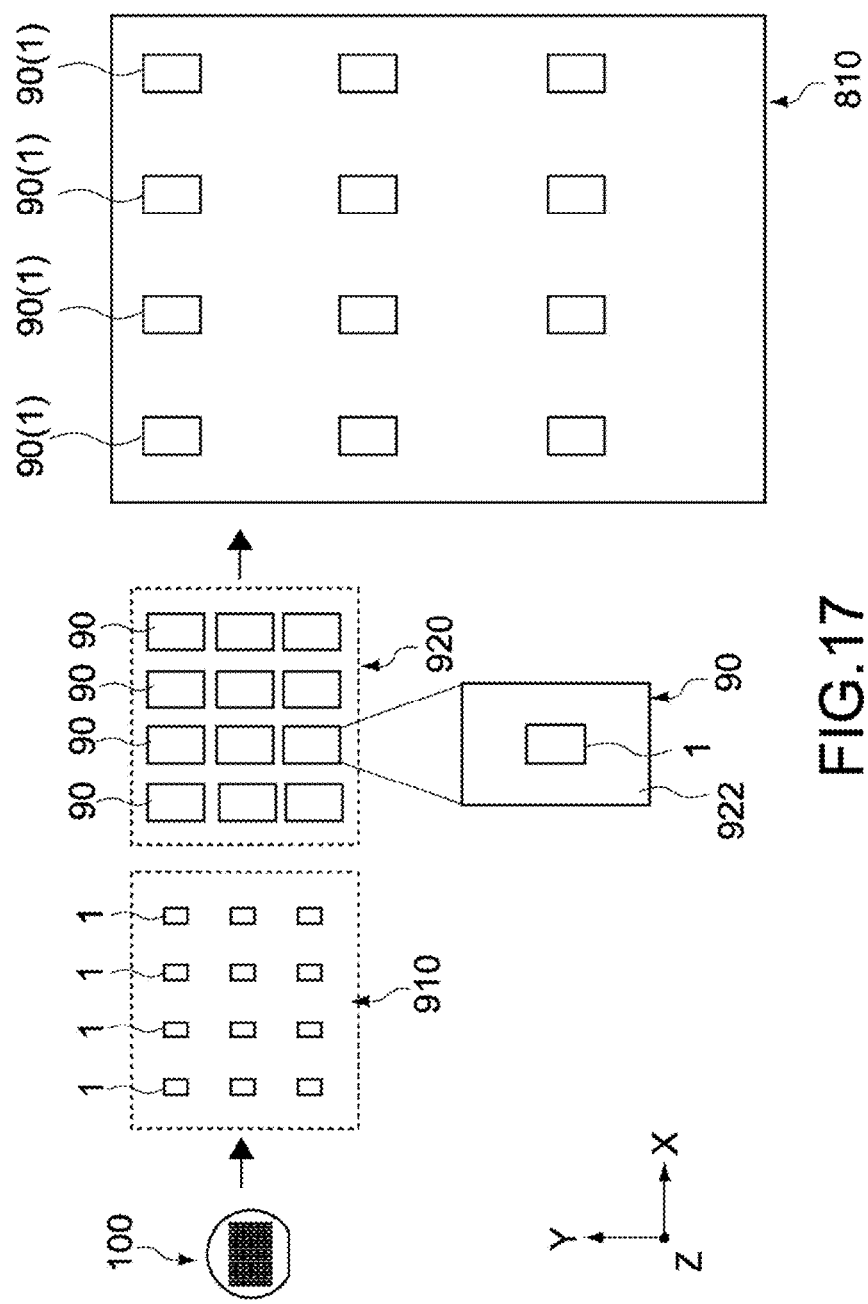

LIGHT-EMITTING ELEMENT WAFER, LIGHT EMITTING ELEMENT, ELECTRONIC APPARATUS, AND METHOD OF PRODUCING LIGHT-EMITTING ELEMENT WAFER

CROSS REFERENCE TO RELATED APPLICATIONS

This application claims the benefit of Japanese Priority Patent Application JP 2013-121462 filed Jun. 10, 2013, the entire contents of which are incorporated herein by reference.

BACKGROUND

The present disclosure relates to a light-emitting element wafer including a semiconductor material, a method of producing the light-emitting element wafer, a light emitting element, and an electronic apparatus using the light emitting element.

A light emitting element that includes a luminescent layer having a laminated structure has been known. In recent years, such a light emitting element is produced as a light-emitting element wafer in which a plurality of light emitting elements are arranged from a viewpoint of reducing the size of the element structure and improving the productivity (see Japanese Patent Application Laid-open No. 2008-172040). Specifically, by causing crystal growth of a luminescent layer on a wafer and forming an element isolation trench on the luminescent layer with a reactive ion etching (RIE) method, a plurality of light emitting elements are formed on the wafer. After that, each light emitting element is isolated from the wafer, and is mounted on an electronic apparatus such as a display apparatus and a lighting apparatus.

SUMMARY

In the method of producing a light-emitting element wafer described in Japanese Patent Application Laid-open No. 2008-172040, the depth of the element isolation trench is significantly affected by the etching rate. Here, it is desirable to use a wafer having a larger area from a viewpoint of mass production. However, it is difficult to obtain a uniform etching rate in a wafer surface as the area of the wafer increases. Therefore, in the case where a wafer having a large area is used, it is difficult to obtain a uniform depth of the element isolation trench in the wafer surface and the height of each element on the wafer is non-uniform, which may affect an electronic apparatus after the wafer is mounted on the electronic apparatus.

Furthermore, in each light emitting element described in Japanese Patent Application Laid-open No. 2008-172040, the luminescent layer is exposed, and it is difficult to ensure electrical insulating properties and physical and chemical stability of the element when a wiring is formed on the luminescent layer.

In view of the circumstances as described above, it is desirable to provide a light-emitting element wafer that is capable of producing elements with a uniform height in large amounts and has high stability of element characteristics, a method of producing the light-emitting element wafer, a light emitting element, and an electronic apparatus using the light emitting element.

According to an embodiment of the present disclosure, there is provided a light-emitting element wafer including a supporting substrate, a luminescent layer, a junction layer, a first inorganic film, a second inorganic film, an isolation trench portion, and a third inorganic film. The luminescent layer is formed of a semiconductor and has a first surface and a second surface, the first surface including a first electrode, the second surface including a second electrode, the second surface being arranged between the supporting substrate and the first surface. The junction layer joins luminescent layer to the supporting substrate and is arranged between the supporting substrate and the second surface. The first inorganic film is formed on the first surface. The second inorganic film is formed between the junction layer and the second surface. The isolation trench portion isolates elements and is formed to have a depth such that the isolation trench portion extends from the first inorganic film to the supporting substrate. The third inorganic film connects the first inorganic film and the second inorganic film.

Because the light-emitting element wafer has a configuration in which the junction layer, the second inorganic film, the luminescent layer, and the first inorganic film are laminated on the supporting substrate, and the isolation trench portion isolates them for each element, many elements with a uniform height can be formed on the supporting substrate. Therefore, it is possible to improve the uniformity of the shape of the elements on the light-emitting element wafer while maintaining high productivity. In addition, the first, second, and third inorganic films reliably protect the luminescent layer, and it is possible to ensure electrical insulating properties of the luminescent layer.

The first inorganic film may have a first end portion formed in parallel with the first surface, the first end portion projecting to the isolation trench portion, and the third inorganic film may have a second end portion that takes an example from the first end portion to project to the isolation trench portion.

Accordingly, it is possible to increase the strength of the element.

Furthermore, the second inorganic film and the third inorganic film may include a first insulating layer, a metal layer, and a second insulating layer, and are formed sequentially, the first insulating layer being formed adjacent to the luminescent layer, the metal layer being formed on the first insulating layer, the second insulating layer being formed on the metal layer.

Accordingly, it is possible to cause light emitted from the luminescent layer to be reflected on the second and third inorganic film, and to increase the emission intensity.

Moreover, the luminescent layer may have a first concavo-convex portion formed on the first surface, and the first inorganic film may have a second concavo-convex portion formed taking an example from the first concavo-convex portion.

Accordingly, it is possible to cause light emitted from the luminescent layer to be reflected on the first and second concavo-convex portions, and to increase the emission intensity.

The luminescent layer may emit red light.

Moreover, specifically, the semiconductor may include at least any one of materials of an AsP compound semiconductor, an AlGaInP compound semiconductor, and a GaAs compound semiconductor.

The first inorganic film may be the first electrode including a transparent conductive material.

Accordingly, it is possible to output, from the entire first surface, light emitted from the luminescent layer, and to increase the output efficiency.

According to an embodiment of the present disclosure, there is provided a light emitting element including a luminescent layer, a first inorganic film, a second inorganic film, and a third inorganic film.

The luminescent layer is formed of a semiconductor and has a first surface, a second surface, and a peripheral surface, the first surface including a first electrode, the second surface including a second electrode and being opposite to the first surface, the peripheral surface connecting the first surface and the second surface. The first inorganic film is formed on the first surface. The second inorganic film is formed on the second surface. The third inorganic film is formed to cover the peripheral surface and connects the first inorganic film and the second inorganic film.

According to an embodiment of the present disclosure, there is provided an electronic apparatus including a substrate and at least one first semiconductor light-emitting element. On the substrate, a drive circuit is formed. The at least one first semiconductor light-emitting element is provided on the substrate and includes a luminescent layer, a first inorganic film, a second inorganic film, and a third inorganic film. The luminescent layer is formed of a semiconductor and has a first surface, a second surface, and a peripheral surface, the first surface including a first electrode connected to the drive circuit, the second surface including a second electrode, the second surface being disposed between the substrate and the first surface, the second electrode being connected to the drive circuit, the peripheral surface connecting the first surface and the second surface. The first inorganic film is formed on the first surface. The second inorganic film is formed between the luminescent layer and the second surface. The third inorganic film is formed to cover that peripheral surface and connects the first inorganic film and the second inorganic film.

Accordingly, the electronic apparatus can be configured to include the first light emitting element in which the luminescent layer is protected and electrical insulating properties of the luminescent layer can be ensured. Thus, it is possible to provide an electronic apparatus with a few flaws.

In addition, the electronic apparatus may further include a plurality of second semiconductor light-emitting elements configured to emit blue light and a plurality of third semiconductor light-emitting elements configured to emit green light, in which the at least one first semiconductor light-emitting element may include a plurality of first semiconductor light-emitting element configured to emit red light, and the plurality of first, second, and third semiconductor light-emitting elements may be arranged on the substrate.

Accordingly, it is possible to provide an electronic apparatus such as a display having high assembly accuracy and desired display properties by using the plurality of first semiconductor elements with high shape uniformity.

According to an embodiment of the present disclosure, there is provided a method of producing a light-emitting element wafer including forming a luminescent layer having a laminated structure in which a semiconductor is laminated on a first substrate. A first inorganic film is formed on a first surface of the luminescent layer, and the first substrate is removed to expose a second surface of the luminescent layer, the second surface being opposite to the first surface. The luminescent layer is etched from the second surface with the first inorganic film being an etching stop layer to form a first isolation trench that isolates the luminescent layer for each element. A second inorganic film that covers the second surface and a wall surface and a bottom surface of the first isolation trench is formed.

Because the first inorganic film laminated on the luminescent layer functions as an etching stop layer when the first isolation trench is formed, it is possible to increase the uniformity of the depth of the first isolation trench. Therefore, it is possible to improve the productivity and to increase the shape uniformity of each element. Moreover, because the first inorganic film is formed on the bottom surface of the first isolation trench and the second inorganic film is formed on the bottom surface, the first and second inorganic films cover the surface of the luminescent layer. Therefore, it is possible to improve the insulating properties of the luminescent layer and to protect the luminescent layer.

The forming of the first isolation trench may include etching the luminescent layer by a dry etching method.

Accordingly, it is possible to reduce the side etching as compared with the case of a wet etching method, and to perform a fine process on the first isolation trench.

The forming of the first isolation trench may include forming the first isolation trench so that a cross-sectional area of the luminescent layer for each element is gradually increased from the second surface to the first surface.

Accordingly, it is possible to easily form the second inorganic film.

The forming of the second inorganic film may include forming the first insulating layer on the second surface and the wall surface and the bottom surface of the first isolation trench, forming a metal layer on the first insulating layer, and forming a second insulating layer on the metal layer.

Accordingly, it is possible to cause light emitted from the luminescent layer to be reflected on the metal layer, and to increase the emission intensity.

The method of producing a light-emitting element wafer may further include forming a first concavo-convex structure on the first surface before the forming of the first inorganic film and after the forming of the luminescent layer.

Moreover, the forming of the first inorganic film may include taking an example from the first concavo-convex structure to form a second concavo-convex structure.

Accordingly, it is possible to form the first concavo-convex structure on a flat surface to have a desired shape right after the luminescent layer is formed. Therefore, it is possible to cause light emitted from the luminescent layer to be effectively reflected on the first concavo-convex structure, and to increase the emission intensity.

Furthermore, the method of producing a light-emitting element wafer may further include detachably joining the second substrate to the first inorganic film via a tentative a tentative junction layer before the exposure of the second surface and after the forming of the first inorganic film.

Accordingly, it is possible to improve the handling properties of the formed element structure.

Furthermore, the method of producing a light-emitting element wafer may further include forming an electrode for each device on the second surface before the forming of the first isolation trench after the exposure of the second surface, removing a part of the second inorganic film to expose the electrode after the forming of the second inorganic film, forming an external connection terminal that is electrically connected to the electrode on the second surface, and detachably joining a third substrate to the external connection terminal via the junction layer.

Accordingly, it is possible to easily ensure a wiring when the light emitting element is mounted on an electronic apparatus or the like. In addition, because the third substrate is joined, it is possible to improve the handling properties of the formed element structure.

Furthermore, the method of producing a light-emitting element wafer may further include removing the second substrate to expose the first inorganic film, and etching the first inorganic film remained on the bottom surface of the first isolation trench to form a second isolation trench that isolates the first inorganic film for each element, after the joining of the third substrate.

Accordingly, because the elements are isolated, it is possible to easily transfer each element to another transfer substrate, a wiring substrate, or the like.

Furthermore, the method of producing a light-emitting element wafer may further include preparing a transfer substrate arranged to face the first inorganic film, and isolating the external connection terminal from the third substrate by laser ablation of the junction layer to transfer each element on the transfer substrate, after the forming of the second isolation trench.

By the laser ablation, it is possible to easily transfer each element to a predetermined position on the transfer substrate without processes such as mechanical removal of a substrate. In addition, by using the transfer substrate, the elements can be arranged at sufficient intervals, and a wiring can be smoothly formed between the elements, for example. Therefore, it is possible to easily mount each element on the wiring substrate or the like of the electronic apparatus or the like.

As described above, according to the present disclosure, it is possible to provide a light-emitting element wafer that is capable of producing elements with a uniform height in large amounts and has high stability of element characteristics, a method of producing the light-emitting element wafer, a light emitting element, and an electronic apparatus using the light emitting element.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 4A is a schematic cross-sectional view of a main portion of the light emitting element, and FIG. 4B is a diagram showing a correlation between a refractive index N and a thickness t (nm) of the first inorganic film of the light emitting element and light orientation distribution;

FIGS. 13A and 13B are each a schematic cross-sectional view for explaining a process of forming a reflection film (second inorganic film) in the method of producing the light-emitting element wafer;

FIG. 17 is a schematic plan view for explaining the method of producing the display apparatus;

DETAILED DESCRIPTION OF EMBODIMENTS

Hereinafter, embodiments of the present disclosure will be described with reference to the drawings.

(First Embodiment)

Figure 1:
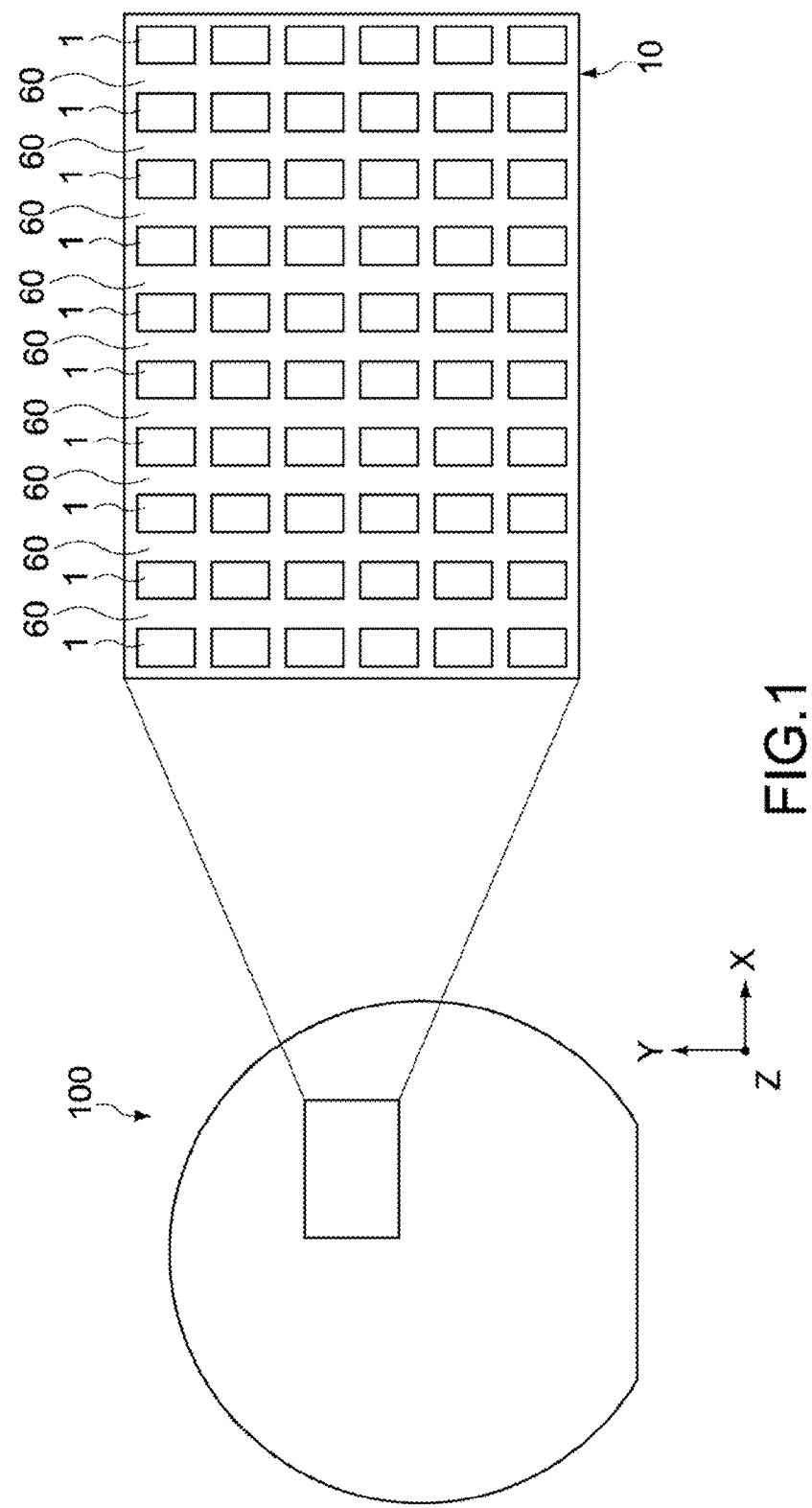
FIG. 1 is a schematic plan view of a light-emitting element wafer according to a first embodiment of the present disclosure.
Figure 2:
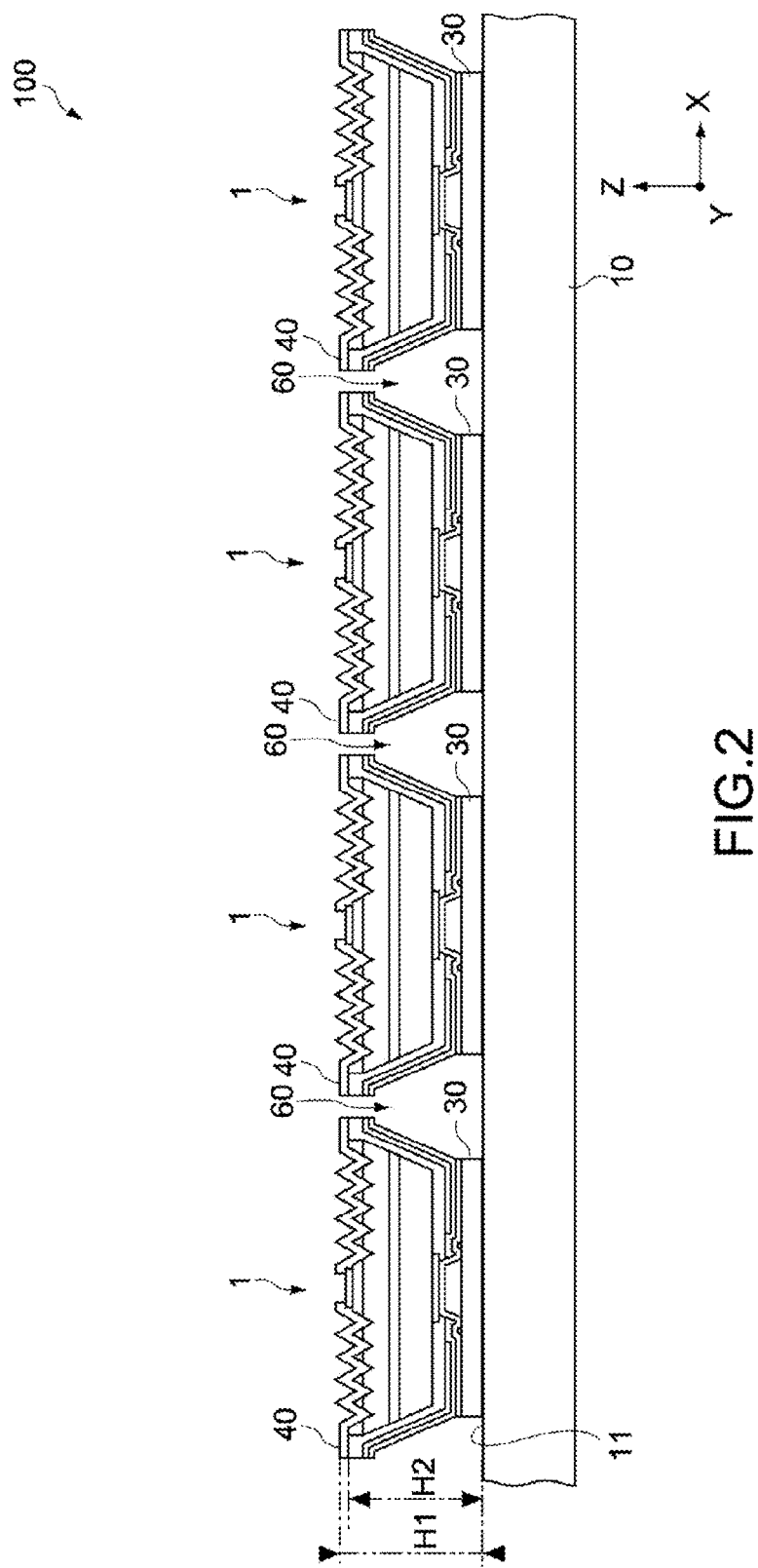
FIG. 2 is a schematic cross-sectional view of the light-emitting element wafer.

FIG. 1 is a schematic plan view of a light-emitting element wafer 100 according to a first embodiment of the present disclosure, and FIG. 2 is a schematic cross-sectional view of the light-emitting element wafer 100. Hereinafter, the configuration of the light-emitting element wafer 100 according to this embodiment will be described. It should be noted that in FIGS. 1 and 2, an X-axis and Y-axis represent directions orthogonal to each other (in-plane direction of the light-emitting element wafer 100), and a Z-axis is a direction orthogonal to the X-axis and the Y-axis (thickness direction of the light-emitting element wafer 100, i.e., vertical direction).

(Semiconductor Light-Emitting Element Wafer)

The light-emitting element wafer 100 includes a supporting substrate 10, a plurality of light emitting elements 1, and isolation trench portions 60. The light-emitting element wafer 100 has a configuration in which the plurality of light emitting elements 1 are arranged on the supporting substrate 10. The light-emitting element wafer 100 according to this embodiment is used to supply the light emitting elements 1 to be mounted on an electronic apparatus such as a display apparatus and a lighting apparatus, as will be described later.

The supporting substrate 10 has a surface 11 on which the light emitting elements 1 are arranged, and includes, for example, a 2 to 12-inch wafer. The supporting substrate 10 includes, for example, a material having a high transmittance of a wavelength of a laser to be applied in a production process to be described later, e.g., sapphire ($Al_2O_3$).

The plurality of light emitting elements 1 are arranged on the supporting substrate 10 along the X-axis direction and the Y-axis direction, and adjacent light emitting elements 1 are isolated by the isolation trench portion 60. Specifically, the isolation trench portion 60 is formed to have a depth extending from a first inorganic film 40 of the plurality of light emitting elements 1, which will be described later, to the surface 11 of the supporting substrate 10, and isolates the light emitting elements 1. It should be noted that in the following description, the light emitting elements 1 will be referred to simply also as "the elements 1."

(Light Emitting Element)

The light emitting element 1 includes a light emitting diode (LED) having a laminated structure of a semiconductor compound. In this embodiment, the plurality of light emitting elements 1 are arranged on the supporting substrate 10. The size of the light emitting element 1 can be appropriately set depending on the size of the supporting substrate 10, the configuration of the electronic apparatus on which the light emitting element 1 is mounted, or the like, and the light emitting element 1 may have a length of not less than 1 μm and not more than 300 μm along the X-axis direction, and a length of not less than 1 μm and not more than 300 μm along the Y-axis direction, and a height of not less than 1 μm and not more than 20 μm along the Z-axis direction, for example.

Figure 3:
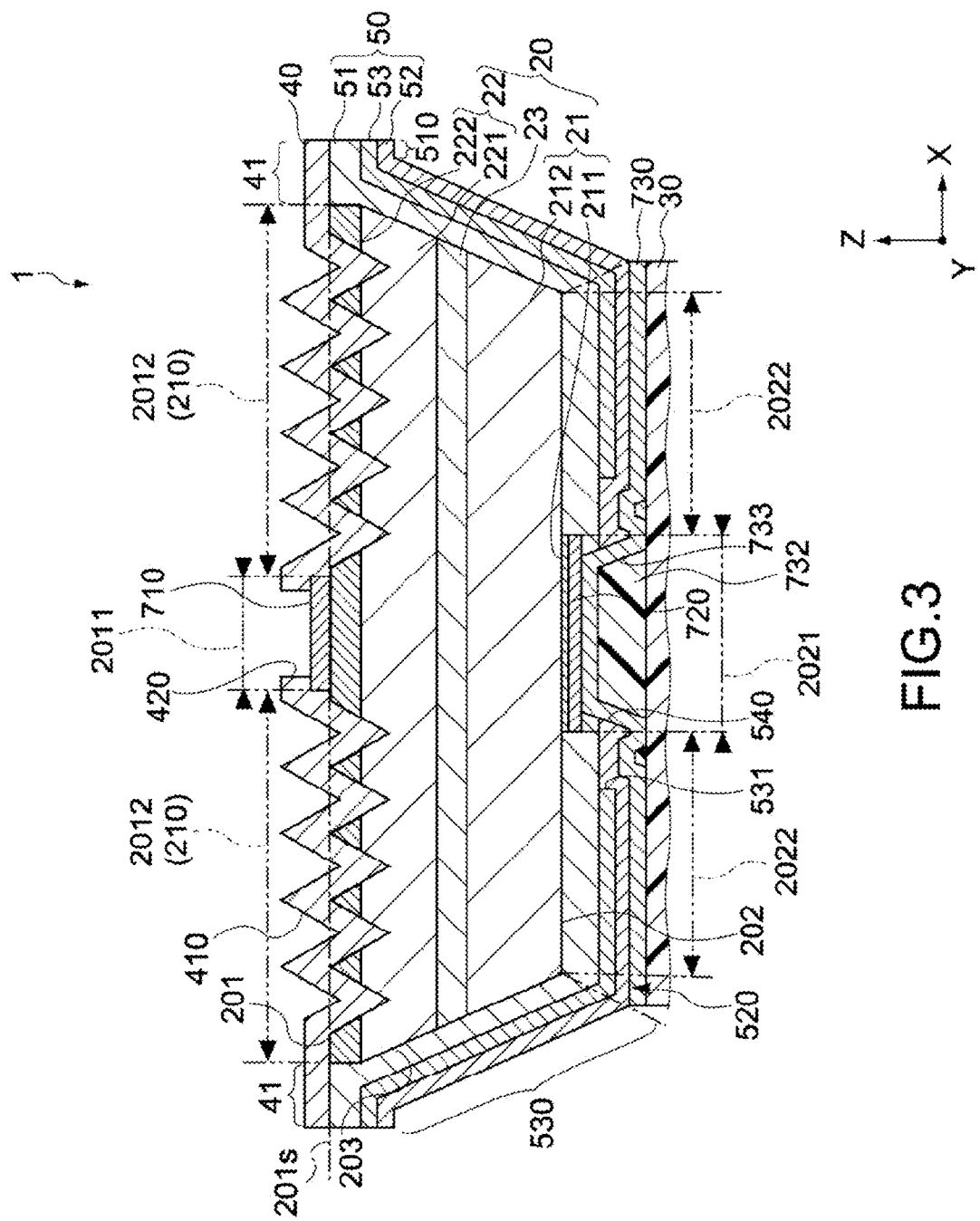
FIG. 3 is a schematic cross-sectional view showing the configuration of a light emitting element shown in FIG. 1.

FIG. 3 is a schematic cross-sectional view showing the configuration of the light emitting element 1. The light emitting element 1 includes a luminescent layer 20, a junction layer 30, the first inorganic film 40, a second inorganic film 520, and a third inorganic film 530. Moreover, the second inorganic film 520 and the third inorganic film 530 are collectively referred to also as the reflection film (second inorganic film 50).

The luminescent layer 20 has a first surface 201 including a first electrode 710 and a second surface 202 that includes a second electrode (electrode) 720 and is arranged between the supporting substrate 10 and the first surface 201, and is formed of a semiconductor.

The junction layer 30 is arranged between the supporting substrate 10 and the second surface 202, and joins the luminescent layer 20 to the supporting substrate 10.

The first inorganic film 40 is formed on the first surface 201.

The second inorganic film 520 is formed between the junction layer 30 and the second surface 202.

The third inorganic film 530 connects the first inorganic film 40 and the second inorganic film 520.

Hereinafter, each component of the light emitting element 1 will be described.

(Luminescent Layer)

In this embodiment, the luminescent layer 20 has a laminated structure of a semiconductor that emits red light, and includes, for example, a GaAs semiconductor compound and an AlGaInP semiconductor compound. The luminescent layer 20 includes a first conductive-type first semiconductor layer 21, an active layer 23 formed on the first semiconductor layer 21, and a second conductive-type second semiconductor layer 22 formed on the active layer 23. In this embodiment, the first conductive type and the second conductive type represent an n-type and a p-type, respectively, but are not limited thereto.

The luminescent layer 20 has the first surface 201, the second surface 202 opposite to the first surface 201, and a peripheral surface 203 that connects the first surface 201 and the second surface 202. The first surface 201 and the second surface 202 are arranged to face each other in the Z-axis direction. The entire thickness of the luminescent layer 20 is not less than about 1 μm and not more than 20 μm. The entire shape of the luminescent layer 20 is not particularly limited. For example, the luminescent layer 20 is formed to have a truncated square pyramid shape. In this case, the luminescent layer 20 is formed so that the cross-sectional area of the luminescent layer 20 perpendicular to the Z-axis direction is gradually increased from the second surface 202 to the first surface 201 and the peripheral surface 203 has four tapered surfaces.

The first surface 201 has a connection area 2011 in which the first electrode 710 is formed, and a light extraction area 2012 in which a first concavo-convex portion 210 is formed. The connection area 2011 occupies the center portion of the first surface 201, and the light extraction area 2012 is arranged to surround the connection area 2011. It should be noted that the position and shape of the connection area 2011 are not limited, and a plurality of connection areas 2011 may be arranged in an island shape.

The first concavo-convex portion 210 may be appropriately configured to obtain desired optical properties of output light. For example, the first concavo-convex portion 210 may have a prism shape having a ridge line as shown in FIG. 3, or groove-like concave portions may be formed on a flat surface (convex portion) (see FIGS. 7 to 12).

Moreover, "the first surface 201 is substantially perpendicular to the Z-axis direction" represents that a reference surface 201s of the first surface 201 is substantially perpendicular to the Z-axis direction. In addition, the reference surface 201s of the first surface 201 represents a virtual flat surface including top portions (top surface) of a plurality of convex portions of the first concavo-convex portion 210.

In this embodiment, the second surface 202 is formed to have the area smaller than that of the first surface 201 when view from the Z-axis direction. The second surface 202 has a connection area 2021 that occupies the center portion of the second surface 202, on which the second electrode 720 is formed, and a reflection area 2022 that surrounds the connection area 2021. The reflection area 2022 is covered by the second inorganic film 520 of the reflection film 50.

In the luminescent layer 20, light emitted from the active layer 23 is output via the light extraction area 2012 of the first surface 201. In this embodiment, the peripheral surface 203 is formed as a tapered surface and is covered by the third inorganic film 530 to be described later, and the light extraction area 2012 of the first surface 201 has the first concavo-convex portion 210. Accordingly, it is possible to increase the output efficiency by reflecting the light toward the upper side of the Z-axis direction, and to control the orientation of light.

The first semiconductor layer 21 has a laminated structure of a first contact layer 211 and a first cladding layer 212. The first contact layer 211 is connected to the second electrode 720, and is formed to have almost the same area as that of the second electrode 720 when viewed from the Z-axis direction, for example. The first contact layer 211 includes a material that is capable of forming ohmic contact with the second electrode 720, e.g., n-type GaAs. The first cladding layer 212 is formed on the first contact layer 211 to occupy the entire second surface 202 when viewed from the Z-axis direction. Specifically, an exposed surface of the first cladding layer 212 forms the reflection area 2022 of the second surface 202. The first cladding layer 212 includes, for example n-type AlGaInP.

The active layer 23 has a multiquantum well structure of a well layer and a barrier layer formed of semiconductors having different compositions, for example, and is formed to be capable of emitting light of a predetermined wavelength. The active layer 23 according to this embodiment is capable of emitting red light of a light emission wavelength of about 500 to 700 nm. The active layer 23 includes about 10 to 20 well layers and about 10 to 20 barrier layers, for example. Each well layer includes GaInP and each barrier layer includes AlGaInP. The well layers and the barrier layers are laminated to each other.

The second semiconductor layer 22 has a laminated structure of a second cladding layer 221 and a second contact layer 222. The second cladding layer 221 is formed on the active layer 23, and includes, for example, p-type AlGaInP. The second contact layer 222 is formed on the second cladding layer 221, and is connected to the first electrode 710. The second contact layer 222 occupies the entire first surface 201 when viewed from the Z-axis direction, and the exposed surface of the second contact layer 222, on which the first electrode 710 is not formed, forms the light extraction area 2012 of the first surface 201. The second contact layer 222 includes a material that is capable of forming ohmic contact with the first electrode 710, e.g., p-type GaP.

It should be noted that in the first and second semiconductor layers 21 and 22, another layer may be appropriately provided between the above-mentioned layers. For example, the second semiconductor layer 22 may include a protective layer between the active layer 23 and the second cladding layer 221. The protective layer includes undoped AlGaInP, and is capable of preventing dopants of the second cladding layer 221 or the like from diffusing to the side of the active layer 23. Moreover, the material shown in each layer of the luminescent layer 20 is given for exemplary purposes, and can be appropriately selected in view of the configuration of the light emitting element 1, desired light emission properties, and the like.

The first electrode 710 is formed in the connection area 2011 of the first surface 201, and is connected to the second contact layer 222. Specifically, the surface of the first electrode 710 forms the connection area 2011 of the first surface 201. The shape of the first electrode 710 is not particularly limited, and the first electrode 710 is formed to have an elliptical shape, a circular shape, or a rectangle shape, with a short axis length of about 1 to 10 μm along the X-axis direction and a long axis length of about 1 to 10 μm along the Y-axis direction, for example. In addition, the thickness of the first electrode 710 may be 200 to 600 μm, for example. The first electrode 710 may include a metal material such as Ti, Pt, Au, Ge, Ni, and Pd, an alloy or laminated body containing them, or a transparent conductive material such as ITO.

The second electrode 720 is formed in the connection area 2021 of the second surface 202, and is connected to the first contact layer 211. Specifically, the surface of the second electrode 720 forms the connection area 2021 of the second surface 202. The shape of the second electrode 720 is not particularly limited, and the second electrode 720 is formed to have a circular shape, for example. However, the shape of the second electrode 720 may be an elliptical shape or a rectangular shape. In addition, the thickness of the second electrode 720 may be 200 to 600 μm, for example. The second electrode 720 may include a metal material such as Ti, Pt, Au, Ge, Ni, and Pd, an alloy or laminated body containing them, or a transparent conductive material such as ITO.

(First Inorganic Film)

The first inorganic film 40 is formed to cover the light extraction area 2012 of the first surface 201. Specifically, the first inorganic film 40 includes a connection hole 420 that is formed on the first electrode 710 (the connection area 2011) and faces the first electrode 710. The thickness of the first inorganic film 40 is, for example, not less than 200 μm and not more than 600 μm, more favorably, not less than 300 μm and not more than 500 μm.

Moreover, the first inorganic film 40 has a second concavo-convex portion 410 that is formed taking an example from the first concavo-convex portion 210 of the first surface 201, and a first end portion 41 that is formed around the second concavo-convex portion 410. The first end portion 41 forms a flat surface that is formed in parallel with the first surface 201, and projects outward of the first surface 201. Here, "formed in parallel with the first surface 201" represents being formed in parallel with the reference surface 201s of the first surface 201.

The first inorganic film 40 has permeability, and includes silicon nitride (hereinafter, referred to as SiN) having a refractive index of not less than 1.9 and not more than 2.3, silicon oxide such as $SiO_2$, or a laminated body of SiN and $SiO_2$, for example. Alternatively, the first inorganic film 40 may include an insulating material such as TiN and $TiO_2$. Accordingly, it is possible to ensure insulating properties of the first surface 201 of the luminescent layer 20, and to cause the first inorganic film 40 to function as a protection film of the first surface 201. Furthermore, as will be described later, because the first inorganic film 40 has a predetermined thickness and a predetermined refractive index, it is possible to increase the emission intensity of the light emitting element 1 in the front direction.

(Reflection Film)

The reflection film 50 includes the second inorganic film 520 and the third inorganic film 530, and is formed to cover the second surface 202 and the peripheral surface 203 of the luminescent layer 20. The reflection film 50 reflects, to the side of the first surface 201, light emitted from the luminescent layer 20, which contributes to improve the output efficiency.

The second inorganic film 520 is formed to cover the reflection area 2022 of the second surface 202 of the luminescent layer 20. In addition, the second inorganic film 520 includes a connection hole 540 that is formed on the second electrode 720 (connection area 2021) and faces the second electrode 720. The entire thickness of the second inorganic film 520 is, for example, not less than 0.1 μm.

The third inorganic film 530 is formed continuously with the second inorganic film 520, and is formed to cover the entire peripheral surface 203 of the luminescent layer 20. Moreover, the third inorganic film 530 has a second end portion 510 that projects outward taking an example from the first end portion 41 of the first inorganic film 40. Specifically, the second end portion 510 is formed as a flange portion of the reflection film 50 that is folded in parallel with the first surface 201. The thickness of the area along the peripheral surface 203 of the third inorganic film 530 is, for example, not less than 0.2 μm, and the thickness of the second end portion 510 is, for example, not less than 0.2 µm and not more than 5 µm.

With this configuration, a height H2 of the second end portion 510 of the reflection film 50 (third inorganic film 530) along the Z-axis direction from the surface 11 of the supporting substrate 10 is lower than a height H1 of the surface of the first inorganic film 40 at the first end portion 41 (see FIG. 2).

The reflection film 50 includes a first insulating layer 51 formed adjacent to the luminescent layer 20, a metal layer 53 formed on the first insulating layer 51, and a second insulating layer 52 formed on the metal layer 53. Specifically, the reflection film 50 has a laminate structure in which the reflection film 50 is continuously formed with the second and third inorganic films 520 and 530.

The first insulating layer 51 covers from the reflection area 2022 of the second surface 202 to the peripheral surface 203, and is formed over the second end portion 510 located immediately below the first end portion 41. On the other hand, the second insulating layer 52 is formed in an area overlapped with the first insulating layer 51 when viewed from the Z-axis direction. The first and second insulating layers 51 and 52 may include silicon oxide such as $SiO_2$, SiN, TiN, $TiO_2$, another insulating inorganic material, or a laminated body thereof.

The metal layer 53 includes an opening 531 that is larger than the connection hole 540, and is formed from a part of the reflection area 2022 to the second end portion 510 via the peripheral surface 203, for example. The metal layer 53 has a function to reflect, to the first surface 201, light emitted from the luminescent layer 20. Specifically, a material having high reflection efficiency of the light emitted from the luminescent layer 20 only has to be adopted. In this embodiment, the metal layer 53 includes a metal material such as Al, Au, Ti, Cu, Ni, and Ag, or an alloy or laminated body thereof.

Moreover, because the metal layer 53 is formed to the second end portion 510, it is possible to reflect light that has entered the first end portion 41 upward in the Z-axis direction, and to output the reflected light. Accordingly, it is possible to increase the intensity of output light in the front direction.

The connection hole 540 is formed by the first and second insulating layers 51 and 52. Specifically, to the peripheral surface of the connection hole 540, the first and second insulating layers 51 and 52 are exposed, and the metal layer 53 is not exposed. Accordingly, insulating properties between the metal layer 53 and the second electrode 720 are maintained.

The first and second end portions 41 and 510 each have an end surface in parallel with the Z-axis direction. In this embodiment, these end surfaces are formed in the same plane. Moreover, as shown in FIG. 3, the first and second insulating layers 51 and 52 and the metal layer 53 may be exposed from the end surface of the second end portion 510. Accordingly, it is possible to increase the heat radiation property of the light emitting element 1. Alternatively, the metal layer 53 may be formed not to be exposed from the end surface of the second end portion 510, or may be formed to cover only the peripheral surface 203.

Furthermore, the light emitting element 1 according to this embodiment further includes an external connection terminal 730 connected to the second electrode 720 that is exposed from the connection hole 540.

(External Connection Terminal)

The external connection terminal 730 is arranged between the junction layer 30 and the second inorganic film 520. The external connection terminal 730 is formed to be connected to the second electrode 720 and to cover the second inorganic film 520 and the second electrode 720, and has a rectangular shape with almost the same size as the second inorganic film 520 when viewed from the Z-axis direction. The thickness of the external connection terminal 730 is not particularly limited, but is not less than 0.1 µm and not more than 0.5 µm, for example. The external connection terminal 730 includes a metal material such as Al, Au, and Ti, or an alloy or laminated body containing them.

It should be noted that as shown in FIG. 3, a resin film 732 may be formed so that a concave portion 733 of the external connection terminal 730, which is formed due to the connection hole 540, is embedded. The resin film 732 includes adhesive resin material, for example. It should be noted that the resin film 732 may be formed not only in the concave portion 733 but also in the entire area in which the external connection terminal 730 is formed (see resin R3 in FIGS. 12A).

(Junction Layer)

With reference to FIG. 2, the junction layer 30 is arranged between the external connection terminal 730 and the supporting substrate 10, and joins the light emitting element 1 to the supporting substrate 10. The thickness of the junction layer 30 is, for example, not less than 0.2 µm and not more than 2 µm. The junction layer 30 includes a thermoplastic resin material having adhesiveness such as polyimide. Therefore, the junction layer 30 is ablated when being heated to evaporation by irradiation of a laser light having a predetermined wavelength, for example. Accordingly, the junction layer 30 can be easily isolated from the supporting substrate 10 by the power of the ablation. The material of the junction layer 30 is not limited to the above, and ultraviolet curable resin, an adhesive sheet, an adhesive material can be adopted, for example.

In each light emitting element 1 having such a configuration, the junction layer 30, the external connection terminal 730, the second inorganic film 520, the luminescent layer 20, and the first inorganic film 40 are laminated in the stated order on the supporting substrate 10. Moreover, these layers are isolated for each element 1 by the isolation trench portions 60 as described above. Specifically, in the light-emitting element wafer 100, the light emitting elements 1 can be formed to have a uniform height on the entire supporting substrate 10. Specifically, variation in heights of the plurality of light emitting elements 1 from the surface 11 on the light-emitting element wafer 100 can be suppressed to 10% or less, for example.

Furthermore, the first, second, and third inorganic films 40, 520, and 530 cover the entire surface of the luminescent layer 20 excluding the connection areas 2011 and 2021. Accordingly, it is possible to ensure insulating properties of the luminescent layer 20 and physical and chemical stability of the luminescent layer 20.

Moreover, in the metal layer 53 having a tapered surface, and the first and second concavo-convex portions 210 and 410, and it is possible to reflect light emitted from the luminescent layer 20 and to efficiently output the light from the first surface 201.

Furthermore, by adjusting the thickness and the refractive index of the first inorganic film 40, it is possible to use interference of light having a predetermined wavelength, and to adjust the orientation of output light of the light emitting element 1. Hereinafter, the operation of the orientation of the output light of the first inorganic film 40 will be described.

(Operation of Orientation of First Inorganic Film)

Figure 4A:
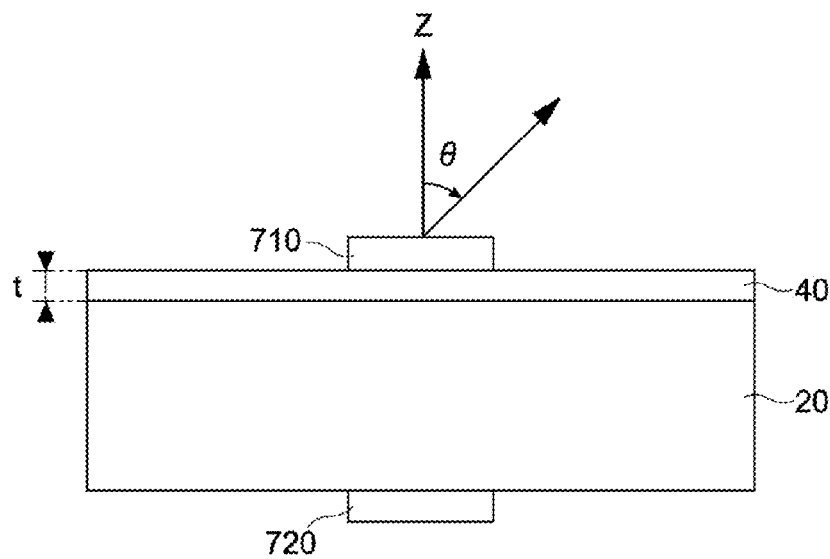
FIGS. 4A and 4B are each a diagram for explaining an operation of orientation of a first inorganic film shown in FIG. 1.
Figure 4B:
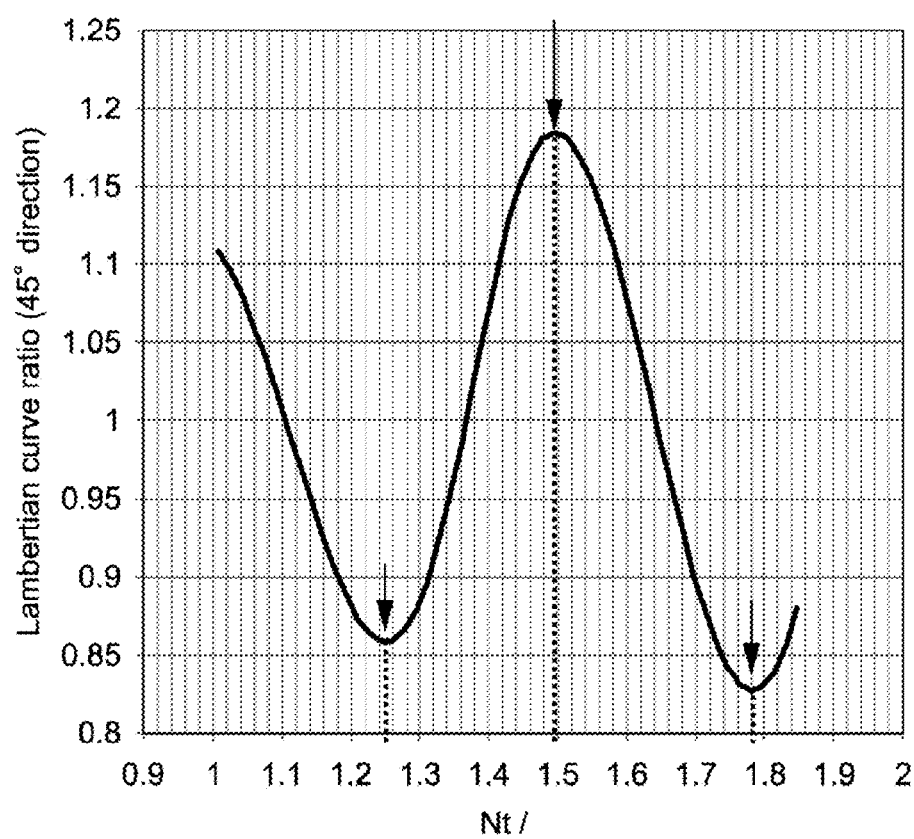

FIG. 4A is a schematic cross-sectional view of the luminescent layer 20 of light emitting element 1, and FIG. 4B is a diagram showing the correlation between the refractive index N and the thickness t (nm) of the first inorganic film 40 and the light orientation distribution. More specifically, the horizontal axis represents a value of $Nt/\lambda$ when the wavelength of output light is assumed to be $\lambda$ (nm), and the vertical axis represents the ratio of actual emission intensity and emission intensity when the far field pattern (FFP) has a Lambertian profile in a direction at an angle of 45 degrees to the normal line direction of the first surface 201 (direction in parallel with the Z-axis direction) (hereinafter, the ratio being referred to as Lambertian curve ratio). It should be noted that the Lambertian represents the state of the FFP of output light. Assuming that an emission angle from the normal line direction of the output surface is $\theta$, the Lambertian represents the light distribution such that the value of the FFP of output light is constant regardless of the angle, when the FFP of output light on an output surface is divided by $\cos\theta$. For example, when the FFP of output light has a Lambertian profile, the emission intensity has a maximum value in the front direction ($\theta=0°$, and the output intensity tends to be decreased as the absolute value of the emission angle $\theta$ is increased.

As shown in FIG. 4B, values of the distribution of the Lambertian carve ratio change at a cycle of $Nt/\lambda$ being about $\frac{1}{2}$ due to the influence of the interference of light. Specifically, the value is concave down (maximum) when $Nt/\lambda$ is about 1.5 (6/4) (hereinafter, referred to as (B)), and is concave up (minimum) when $Nt/\lambda$ is about 1.25 (5/4) (hereinafter, referred to as (A)) and about 1.79 (7/4+0.05) (hereinafter, referred to as (C)).

Figure 5A:
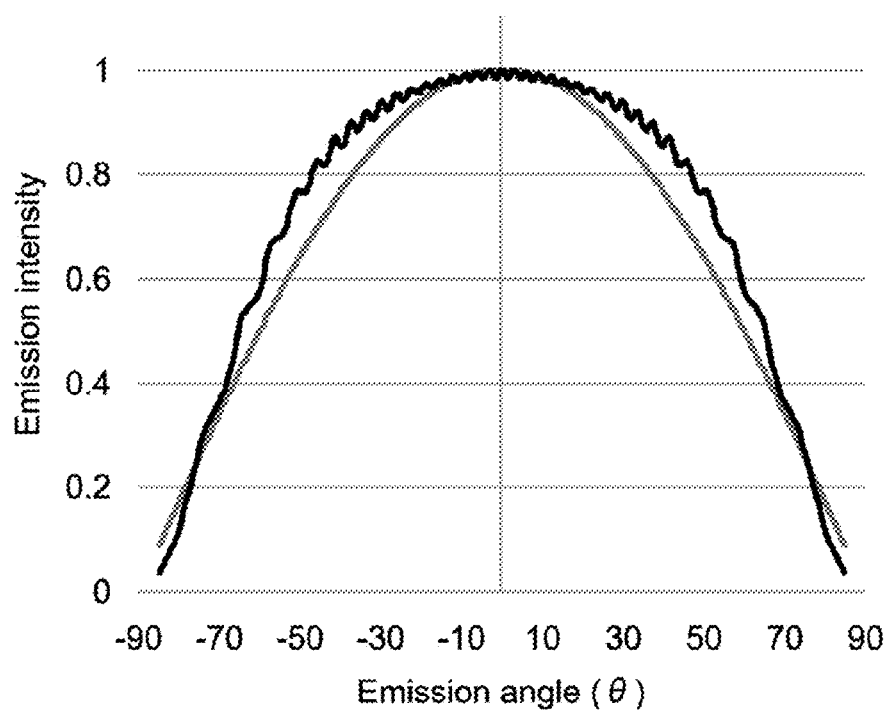
FIGS. 5A and 5B are each a graph showing exemplary distribution of emission intensity with respect to an emission angle θ.
Figure 5B:
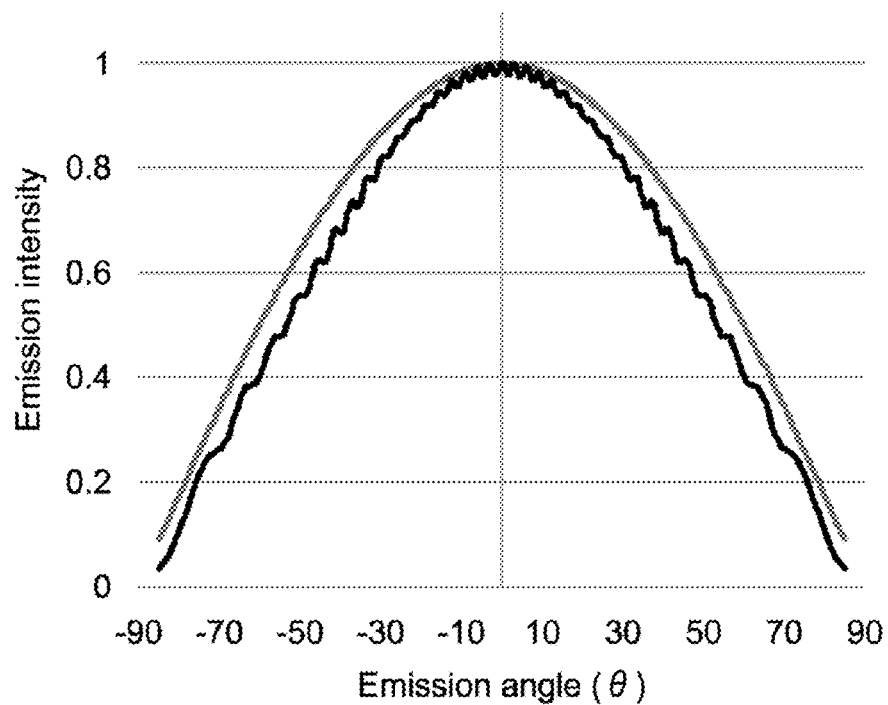

Here, FIGS. 5A and 5B are each a graph showing the distribution of emission intensity with respect to the emission angle $\theta$, FIG. 5A shows an example of the (B) in the graph of FIG. 4B in which the emission intensity is maximum, and FIG. 5B shows an example of the (A) and (C) in the graph of FIG. 4B in which the emission intensity is minimum. In FIGS. 5A and 5B, the FFP in the case of the Lambertian is represented by a light colored line as a reference.

As shown in FIG. 5A, in the case of the (B), the emission intensity is large in the range of $-70<\theta<70$ as compared with the case of Lambertian, and the emission intensity in the front direction ($\theta=0$) is relatively small. On the other hand, as shown in FIG. 5B, in the case of the (A) and (C), the emission intensity is small as a whole as compared with the case of Lambertian, and the emission intensity in the front direction is relatively large.

Based on these results, in order to increase the emission intensity in the front direction, it only needs to adjust the value of $Nt/\lambda$ in the first inorganic film 40 to be concave up as in the (A) and (C) in the graph of FIG. 4B, for example. Therefore, based on the value of $Nt/\lambda$ and the fluctuation cycle of $Nt/\lambda$ in the (A) and (C), it only needs to adjust N (refractive index of the first inorganic film 40), t (thickness of the first inorganic film 40), and $\lambda$ (wavelength of output light of the luminescent layer 20) so as to satisfy the following equation (1):

$$Nt/\lambda=(x+1)/4\pm0.15(x=2,4,6,8) \quad (1).$$

In this embodiment, $\lambda$ is about 630 (nm), for example. Moreover, in the case where SiN is used for the first inorganic film 40, the refractive index N satisfies the equation, $2.0\leq N\leq2.1$, for example. Therefore, by setting the thickness t of the first inorganic film 40 to 141.75 (nm), 393.75 (nm), 552.25 (nm), and 708.75 (nm) in the case where N=2.0 and x=2, 4, 6, and 8, respectively, it is possible to increase the emission intensity in the front direction.

As described above, by adjusting the material and the thickness of the first inorganic film 40 depending on the wavelength of light emitted from the luminescent layer 20 based on the equation (1), it is possible to increase the emission intensity of the light emitted from the luminescent layer 20 in the front direction due to the constructive interference of light having a predetermined wavelength. For example, by adopting SiN that satisfies the equation, $1.9\leq N\leq2.3$, more favorably, $2.0\leq N\leq2.1$, or a laminated structure of SiN and SiO2, or adjusting the thickness of the first inorganic film 40 to satisfy the equation, $200\leq N\leq600$, more favorably, $300\leq N\leq500$, so as to satisfy the equation (1), it is possible to maintain the productivity of the first inorganic film 40 and to improve the light orientation of the light emitting element 1.

Hereinafter, a method of producing the light-emitting element wafer 100 according to this embodiment will be described.

(Method of Producing Light-Emitting Element Wafer)

Figure 6:
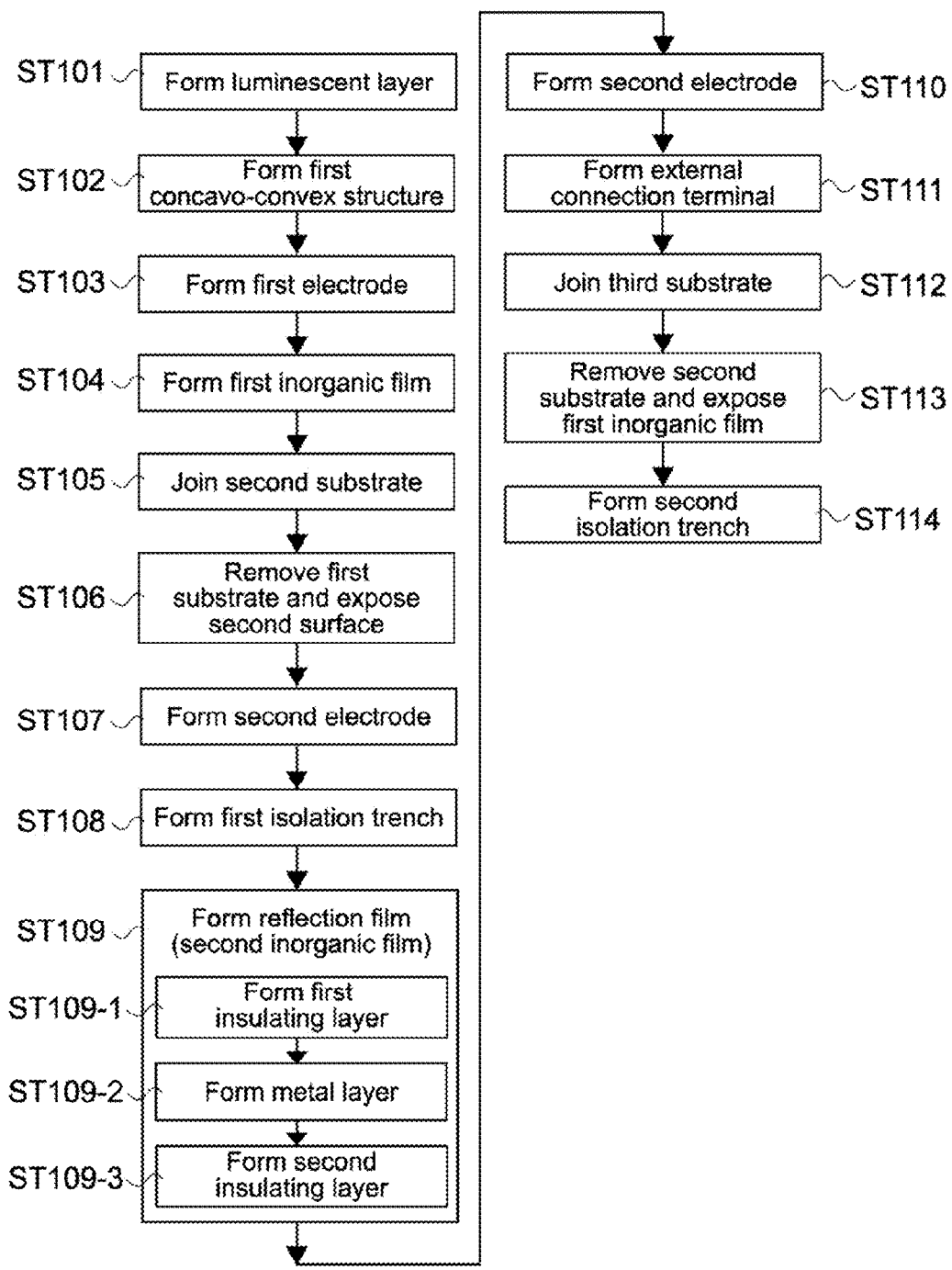
FIG. 6 is a flowchart of a method of producing the light-emitting element wafer.

FIG. 6 is a flowchart of a method of manufacturing the light-emitting element wafer 100 according to this embodiment, and FIGS. 7 to 12 are each a schematic cross-sectional view for explain the production method. Hereinafter, a description will be given with reference to these figures.

A luminescent layer 20a is formed on a first substrate 10a first (ST101). Here, on the first substrate 10a, a metal organic chemical vapor deposition (MOCVD) method is used to cause crystal growth of layers of the luminescent layer 20a. The first substrate 10a is a wafer including, for example, gallium arsenide (GaAs), and a crystal surface on which the luminescent layer 20a is formed is, for example, a C surface (0001).

As described above, on the first substrate 10a, a plurality of element areas 1a corresponding to the elements 1 are defined along the X-axis direction and the Y-axis direction. The plurality of element areas 1a are typically defined by a virtual boarder line L.

On the first substrate 10a, crystal growth of a stop layer 214a, a first contact layer 211a, and a first cladding layer 212a is caused in the stated order first. The first stop layer 214a, the first contact layer 211a, and the first cladding layer 212a are first-conductive type. The stop layer 214a functions as an etching stop layer when the first substrate 10a is removed, and only needs to be formed of a material that is capable of ensuring etch selectivity ratio that is larger than a predetermined value with the first substrate 10a. Of the layers, the stop layer 214a is removed together with the first substrate 10a in a subsequent process. Therefore, the first semiconductor layer 21 of the light emitting element 1 includes the first contact layer 211a and the first cladding layer 212a.

Next, a multiquantum well layer 23a is formed. In the multiquantum well layer 23a, 10 to 20 well layers and 9 to 20 barrier layers are laminated to each other, for example. The multiquantum well layer 23a forms the active layer 23 of the light emitting element 1.

Furthermore, on the multiquantum well layer 23a, crystal growth of a second cladding layer 221a and a second contact layer that are second conductive-type is sequentially caused. It should be noted that the second contact layer is not shown in FIGS. 7 to 12. The second semiconductor layer 22 of the light emitting element 1 includes the second cladding layer 221a and the second contact layer.

It should be noted that the luminescent layer 20a is not limited the above-mentioned configuration, and can be appropriately modified as necessary.

Figure 7A:
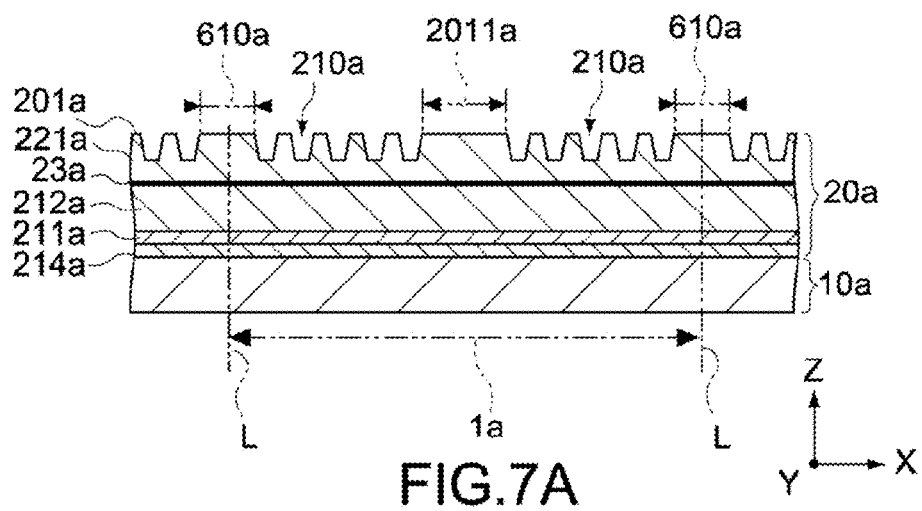
FIGS. 7A, 7B and 7C are each a cross-sectional view for explaining the method of producing the light-emitting element wafer.

Next, as shown in FIG. 7A, on a first surface 201a, a first concavo-convex structure 210a is formed (ST102). The first concavo-convex structure 210a is formed by a photolithography technique, a reactive ion etching (RIE) method, or the like. Moreover, in this process, a connection area 2011a at the center of the element area 1a and a boundary area 610a between the element areas 1a may be covered by a mask (not shown) not to form the first concavo-convex structure 210a. Accordingly, the connection area 2011a and the boundary area 610a can each have a flat surface. The first electrode 710a is formed in the connection area 2011a in the next process, and the first end portion 41 and the isolation trench portion 60 are formed in the boundary area 610a subsequently.

Figure 7B:
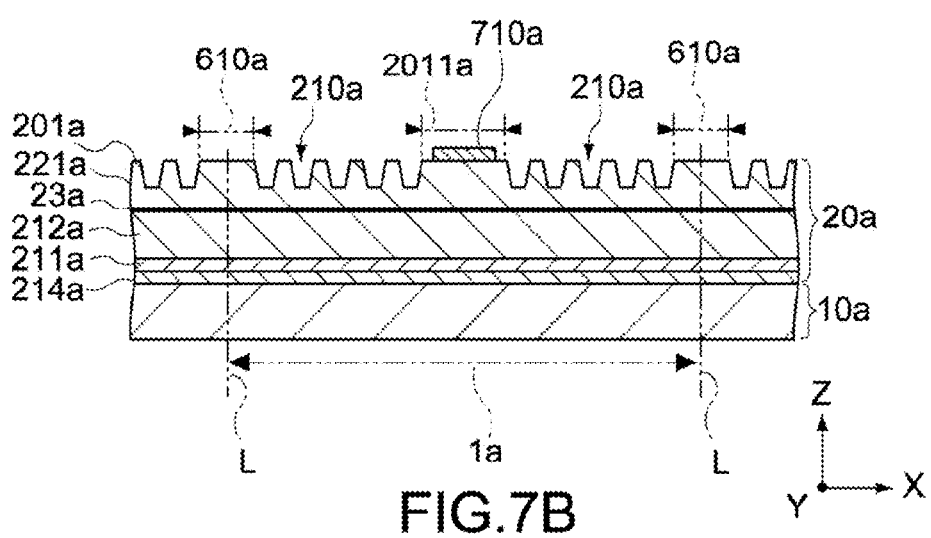

Next, as shown in FIG. 7B, the first electrode 710a is formed in the connection area 2011a of the first surface 201a (ST103). The first electrode 710a is formed by an appropriate method such as a sputtering method, a deposition method, an ion plating method, and a plating method, and is pattern-formed in a predetermined shape such as an elliptical shape. In addition, at least one first electrode 710a is formed for each element area 1a.

Figure 7C:
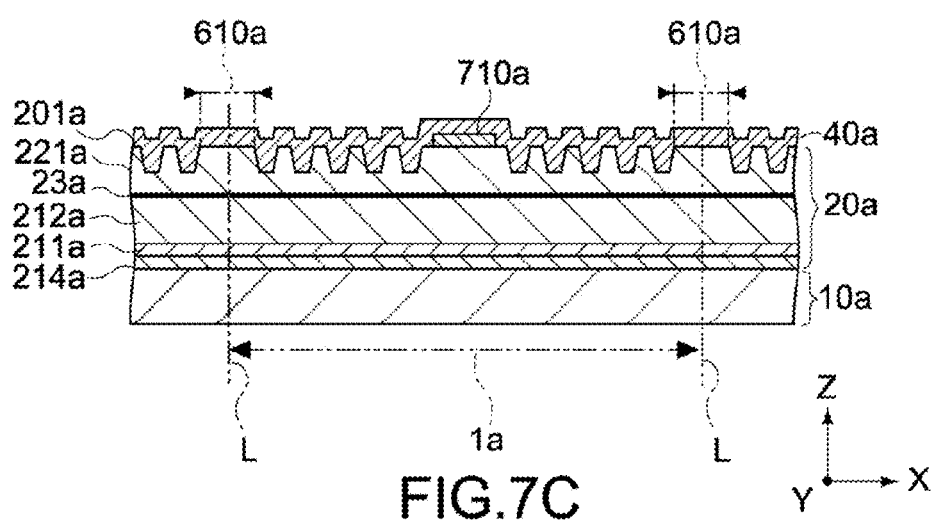

Then, as shown in FIG. 7C, a first inorganic film 40a is formed on the first surface 201a including the first electrode 710a (ST104). The first inorganic film 40a includes SiN, $TiO_2$, $SiO_2$, SiON, NiO, AlO, or a lamination film thereof. In addition, the first inorganic film 40a is formed to have a uniform thickness taking an example from the first surface 201a. Specifically, in this process, a second concavo-convex structure 410a is formed taking an example from the first concavo-convex structure 210a.

Next, a second substrate 10b is detachably joined on the first inorganic film 40a via a temporal junction layer 31a (ST105). In this embodiment, the temporal junction layer 31a has a laminated structure of a first resin film 311a, an adhesive layer 312a, and second resin film 313a. It should be noted that FIG. 8A shows the state vertically inverted from the state shown in FIG. 7C so that the first substrate 10a is arranged on the upper side of the figure.

Figure 8A:
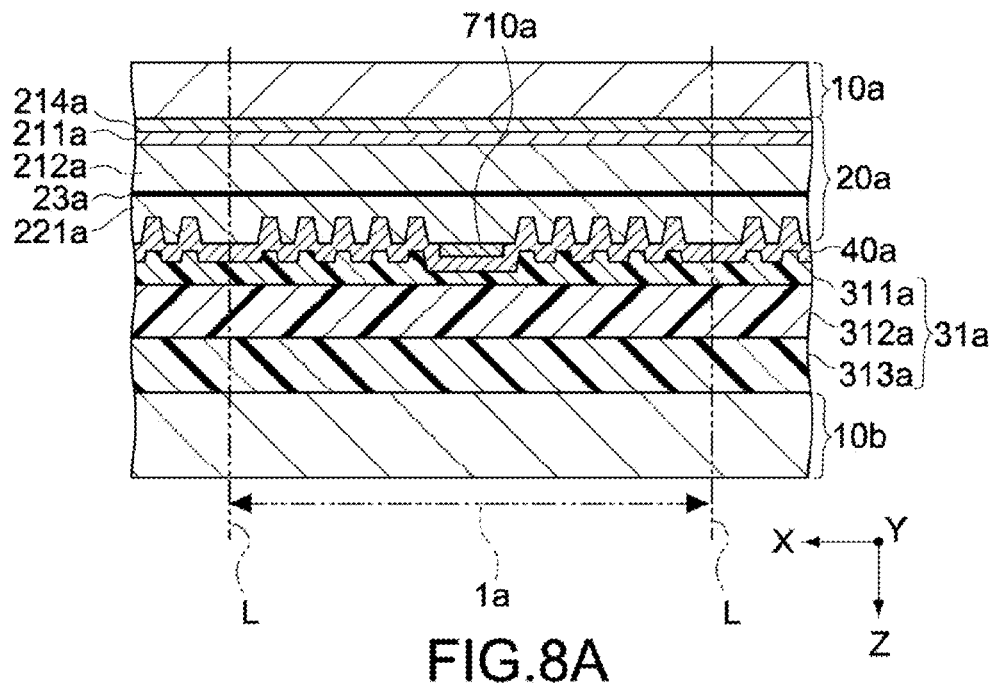
FIGS. 8A and 8B are each a cross-sectional view for explaining the method of producing the light-emitting element wafer.

As shown in FIG. 8A, the first resin film 311a is formed on the first inorganic film 40a by application or the like first. Next, the adhesive layer 312a is attached on the first resin film 311a. The adhesive layer 312a includes a resin adhesive sheet or an adhesive material. Furthermore, the second resin film 313a is formed on the adhesive layer 312a by application or the like.

The first and second resin film 311a and 313a may include a thermosetting resin material having adhesiveness such as polyimide, for example. Accordingly, in the process of removing the second substrate 10b to be described later, the first and second resin film 311a and 313a are ablated when being heated to evaporation by irradiation of a laser light having a predetermined wavelength, for example. Accordingly, the adhesiveness of first and second resin film 311a and 313a can be easily lost by the power of the ablation. The thermosetting resin material is not limited to the above, and any material that is capable of absorbing a laser light having a predetermined wavelength and causing ablation can be used.

Then, as shown in FIG. 8A, the second substrate 10b is attached on the second resin film 313a of the temporal junction layer 31a. In this embodiment, the second substrate 10b is a disk-shaped semiconductor wafer including sapphire ($Al_2O_3$) or the like.

It should be noted that the configuration of the temporal junction layer 31a is not limited to the above, and the temporal junction layer 31a may include only the first resin film 311a and the adhesive layer 312a, for example. Moreover, in the above-mentioned process, a part or all of the temporal junction layer 31a may be formed on the second substrate 10b in advance, and the first inorganic film 40a and the second substrate 10b may be joined.

Figure 8B:
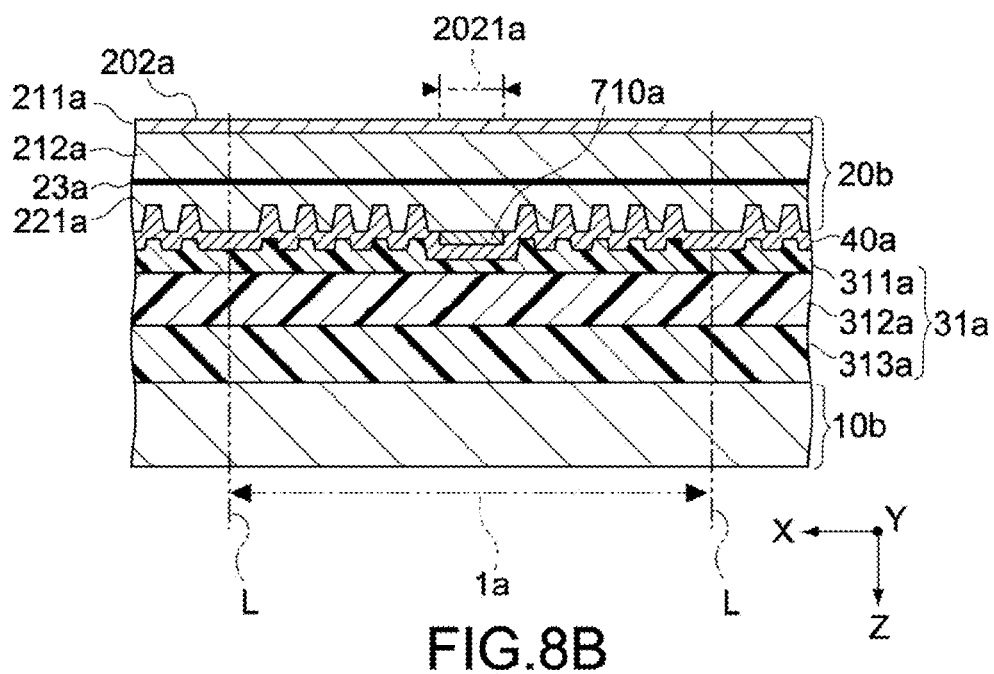

Next, as shown in FIG. 8B, the first substrate 10a is removed to expose a second surface 202a of the luminescent layer 20a, which is opposite to the first surface 201a (ST106). In this process, the first substrate 10a is removed by a wet etching method or the like first. At this time, an etchant having a high etch selectivity ratio with the stop layer 214a and the first substrate 10a is used. Accordingly, the wet etching is suppressed at the stop layer 214a, and thus the first substrate 10a can be reliably removed. Furthermore, the stop layer 214a is removed by a dry etching method or the like. Accordingly, the first contact layer 211a is exposed on the luminescent layer 20a.

It should be noted that in this process, the second surface 202a is formed of the surface of the first contact layer 211a. Moreover, the configuration including the layers from the first contact layer 211a to the second cladding layer 221a (second contact layer) is referred to as a luminescent layer 20b.

Figure 9A:
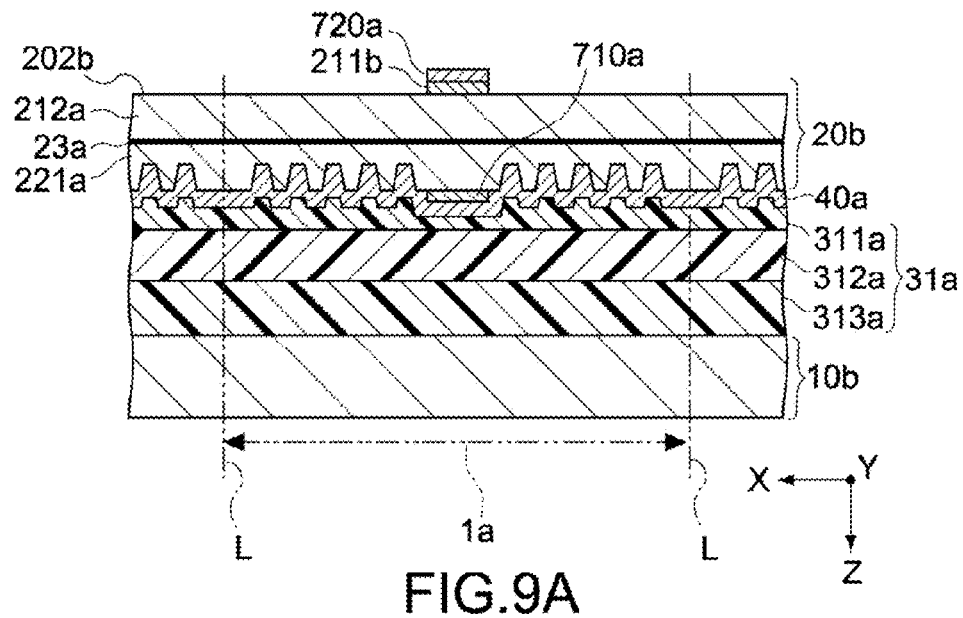
FIGS. 9A and 9B are each a cross-sectional view for explaining the method of producing the light-emitting element wafer.

Next, with reference to FIG. 9A, a second electrode (electrode) 720a is formed on the second surface 202a (ST107). The second electrode 720a is pattern-formed in a circular shape having a diameter of about 1 to 20 μm, for example. At least one second electrode 720a is formed for each element area 1a.

Furthermore, in this embodiment, the first contact layer 211a is etched using the second electrode 720a as a mask. Accordingly, as shown in FIG. 9A, the first contact layer 211a is removed excluding the area located immediately below the second electrode 720a. The pattern-formed first contact layer is referred to as the first contact layer 211b. Moreover, in this process and following processes, the second surface is formed of the surfaces of the second electrode 720a and a second cladding layer 212a, and is referred to as the second surface 202b.

Figure 9B:
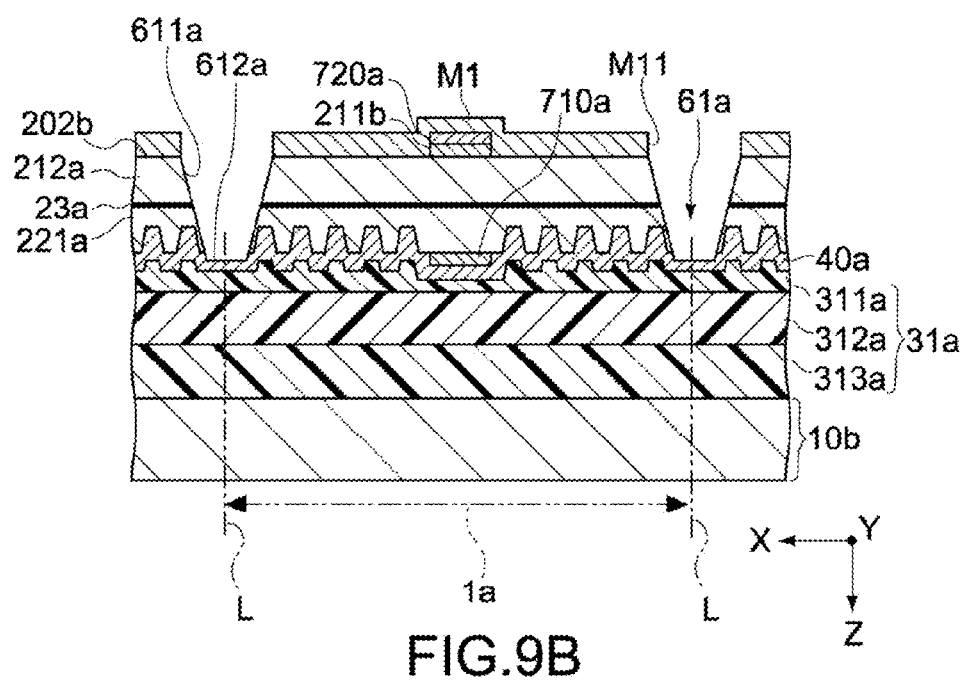

Next, as shown in FIG. 9B, the luminescent layer 20a is etched from the second surface 202b using the first inorganic film 40a as an etching stop layer, and a first isolation trench 61a that isolates the luminescent layer 20a for each element (element area) 1a is formed (ST108). In this process, the luminescent layer 20a is etched by a dry etching method, for example.

A mask layer M1 is formed for each element area 1a on the second surface 202b first. The mask layer M1 is pattern-formed for each element area 1a in a shape corresponding to the second surface 202 after the formation of the element 1. Specifically, the mask layer M1 includes an opening M11 formed along the boundary between the element areas 1a. Moreover, the material of the mask layer M1 may be any material that has a low etching rate in the etchant used in this process. For example, $SiO_2$, SiN, Ti, Ni, Cr, Al or the like is employed.

Then, a dry etching is performed via the opening M11 of the mask layer M1 to form the first isolation trench 61a along the boundary between the element areas 1a. At this time, an etching gas (etchant) having a high etch selectivity ratio with a semiconductor including AlGaInP, GaAs, GaP, or the like being the material of the luminescent layer 20a and SiN or SiO2 being the material of the first inorganic film 40a is used. Examples of such an etchant include $SiCl_4$.

Accordingly, even if the etching rate is not uniform in the plane of the first substrate 10a, the first isolation trench 61a can be formed in the plane to have a uniform depth because the first inorganic film 40a functions as an etching stop layer. It should be noted that in the following description, the etching gas used in a dry etching is also referred to as the etchant.

Moreover, in this process (ST108), the luminescent layer 20a can be formed for each element 1a to have a cross-sectional area that gradually is increased from the second surface 202b to the first surface 201a. Specifically, the cross-sectional area of the opening of the first isolation trench 61a on the side of the second surface 202b is larger than the cross-sectional area of a bottom surface 612a. Such a first isolation trench 61a can be appropriately formed under the condition of taper etching. The specific etching condition depends on the size of a wafer, the configuration of an etching apparatus, and the like. For example, the antenna power is 100 to 1000 W, the bias power is 10 to 100 W, the processing pressure is 0.25 to 1 Pa, and the substrate temperature is 100 to 200° C. It should be noted that the "cross-sectional area" represents a cross-sectional area in a direction perpendicular to the Z-axis direction. Then, after the first isolation trench 61a is formed, the mask layer M1 is removed by an etching or the like.

In this process (ST108), the first isolation trench 61a having a wall surface 611a to be a tapered surface and the bottom surface 612a is formed. The end surfaces of the layers of the luminescent layer 20b excluding the first contact layer 211b are exposed to the wall surface 611a, and the first inorganic film 40a is exposed to the bottom surface 612a. Moreover, the wall surface 611a corresponds to the peripheral surface 203 of the light emitting element 1.

Figure 10A:
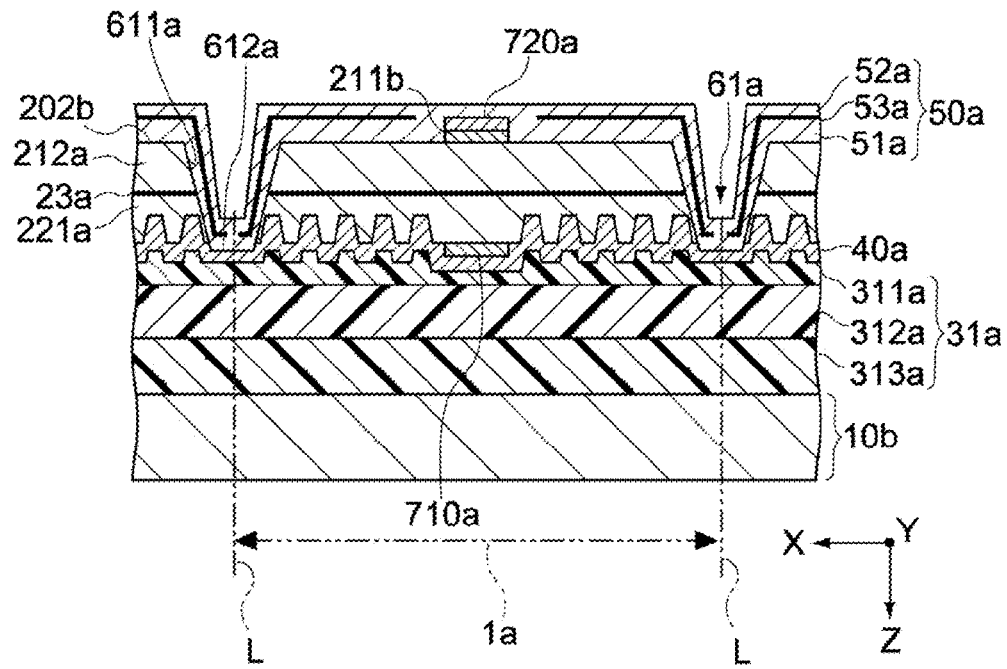
FIGS. 10A and 10B are each a cross-sectional view for explaining the method of producing the light-emitting element wafer.

Next, as shown in FIG. 10A, a reflection film (second inorganic film) 50a that covers the wall surface 611a and the bottom surface 612a of the first isolation trench 61a and the second surface 202b is formed (ST109). As described above, the reflection film 50a has a laminated structure of a first insulating layer 51a, a metal layer 53a, and a second insulating layer 52a, which are formed in the stated order.

FIGS. 13 and 14 are each a schematic cross-sectional view for explaining this process (ST109). It should be noted that in FIGS. 13 and 14, the layers of the first and second concavo-convex structures 210a and 410a and the temporal junction layer 31a, and the second substrate 10b are not shown.

As shown in FIG. 13A, the first insulating layer 51a is formed on the wall surface 611a and the bottom surface 612a of the first isolation trench 61a and the second surface 202b (ST109-1). In this process, a CVD method, a sputtering method, or the like can be used. Alternatively, a resin material such as SOG (applying material for forming an SiO2 coating film) can be used to form the first insulating layer 51a by a spin coating method or application. Moreover, these methods can be used to form a laminated structure. Specifically, in this embodiment, because the wall surface 611a is formed to have a tapered shape, the first insulating layer 51a can be easily formed using a material having a relatively low viscosity.

Next, the metal layer 53a is formed on the first insulating layer 51a (ST109-2). For the pattern-formation of the metal layer 53a in this process, a lift-off method is adopted, for example. Specifically, as shown in FIG. 13B, a resist R1 is formed on the area in which the metal layer 53a should be prevent from being formed. As the resist R1, a positive resist or a negative resist may be adopted. It should be noted that by using the positive resist, the halation during exposure can be suppressed. Moreover, the area in which the resist R is formed specifically includes the area including the second electrode 720a and the area at the center of the bottom surface 612a when viewed from the Z-axis direction. These areas correspond to the opening 531 of the metal layer 53 and the isolation trench portions 60 when the element 1 is completed, respectively.

Specifically, a metal layer 53b is formed first on the entire surface of the first insulating layer 51a including the resist R1 by an appropriate method such as a sputtering method, a deposition method, an ion plating method, and a plating method. For example, for the metal layer 53b, a laminate structure of Al and Au is appropriately adopted. Accordingly, it is possible to reflect light having a wavelength of about 500 to 700 nm at a high reflectance. Moreover, by using a sputtering method, it is possible to improve the adhesiveness between the metal layer 53b and the first insulating layer 51a.

Figure 14A:
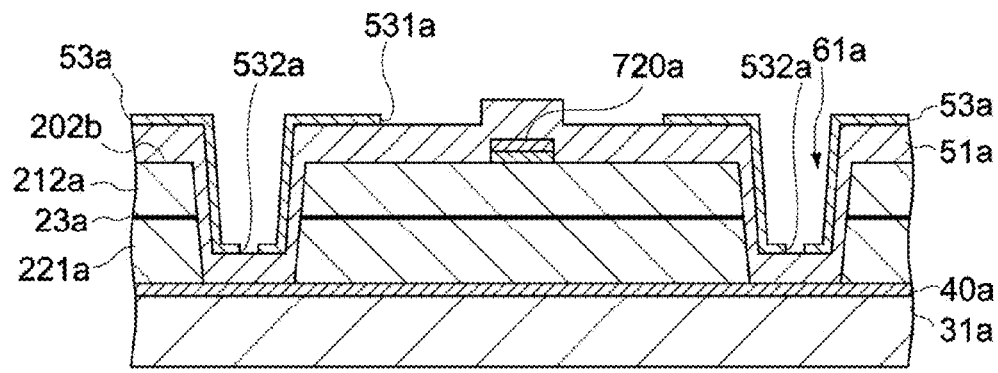
FIGS. 14A and 14B are each a schematic cross-sectional view for explaining the process of forming the reflection film (second inorganic film) in the method of producing the light-emitting element wafer.

Then, the resist R1 to which the metal layer 53b is attached is removed. Accordingly, as shown in FIG. 14A, the metal layer 53a including an opening 531a corresponding to the opening 531 and a second opening 532a is formed.

Figure 14B:
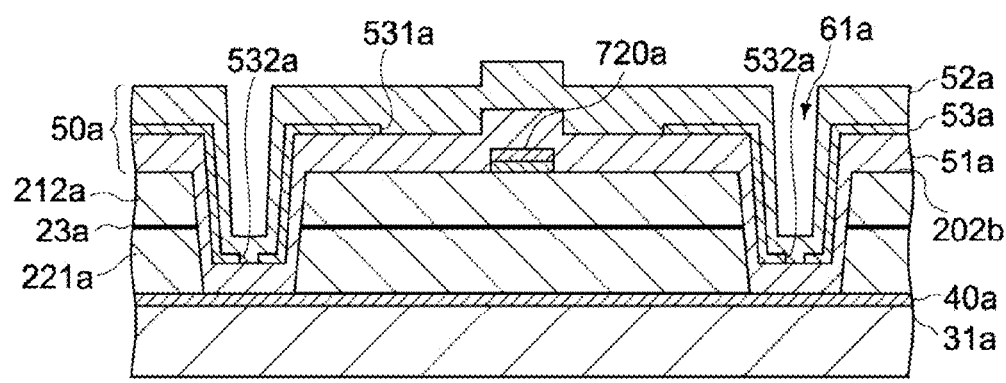

Furthermore, as shown in FIG. 14B, the second insulating layer 52a is formed on the metal layer 53a (ST109-3). In this process, the entire surfaces of the metal layer 53a and the first insulating layer 51a are covered by the second insulating layer 52a. As the method of forming the second insulating layer 52a, a CVD method, a sputtering method, or an application method can be appropriately adopted similarly to the first insulating layer 51a.

Accordingly, in the entire inner surfaces of the second surface 202b and the first isolation trench 61a, the reflection film 50a is formed. The reflection film 50a on the second surface 202b corresponds to the second inorganic film 520, and the reflection film 50a on the wall surface 611a corresponds to the third inorganic film 530.

As described above, in this embodiment, the metal layer 53a is formed by a lift-off method. Therefore, it is possible to suppress the influence of side etching of the resist and to form the metal layer 53a having a desired shape. Moreover, even if the metal layer 53a is formed of chemically stable metal, it is possible to easily perform a fine process.

Figure 10B:
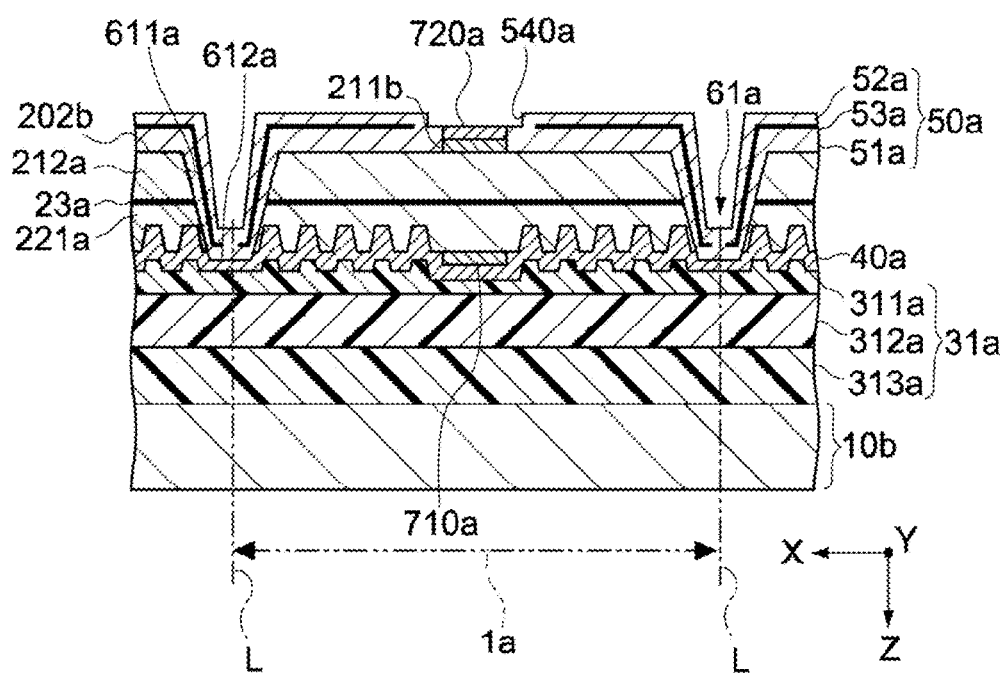

As the next process, as shown in FIG. 10B, a part of the reflection film 50a is removed to expose the second electrode 720a (ST110). Accordingly, a connection hole 540a is formed in the first insulating layer 51a and the second insulating layer 52a of the reflection film 50a. In this process, a resist (not shown) on which the pattern of the shape corresponding to the second electrode 720a is formed is formed first, and an etching method or the like via the resist is used.

Figure 11A:
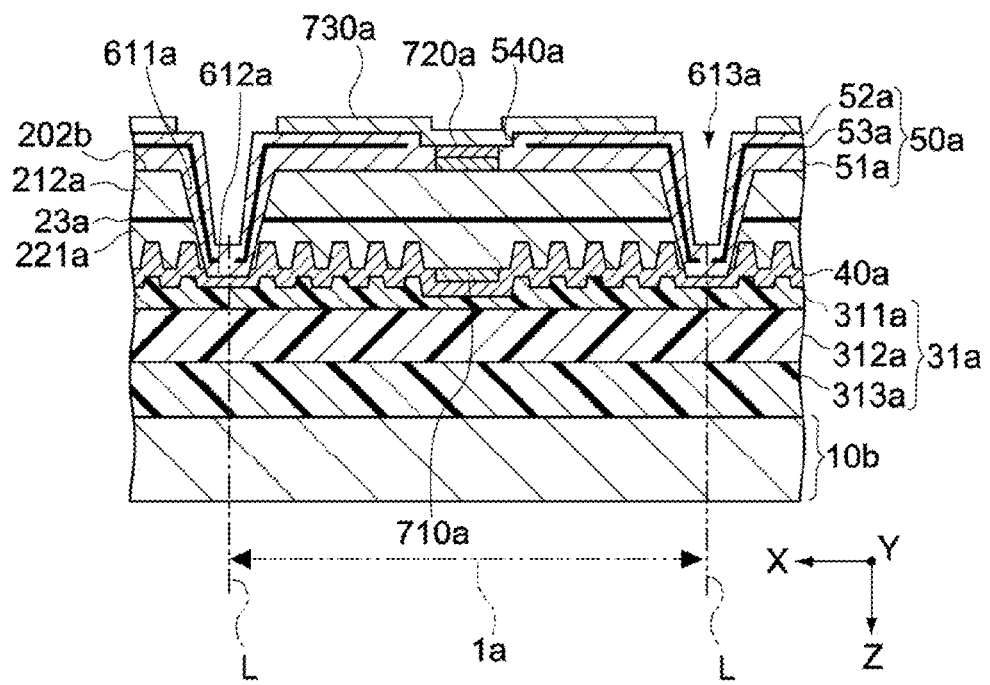
FIGS. 11A and 11B are each a cross-sectional view for explaining the method of producing the light-emitting element wafer.

Then, as shown in FIG. 11A, an external connection terminal 730a that is electrically connected to the second electrode 720a is formed on the second surface 202b (ST111). A metal film may be formed on the second surface 202b by an appropriate method such as a sputtering method, a deposition method, an ion plating method, and a plating method, and the metal film may be patterned into a predetermined shape by a wet etching method, a dry etching, or the like, thereby forming the external connection terminal 730a according to this process. Alternatively, a metal film may be formed after a resist having a predetermined pattern is formed by a lift-off method, thereby forming the external connection terminal 730a. Accordingly, the external connection terminal 730a is formed on the second electrode 720a in the connection hole 540a and on the reflection film 50a on the second surface 202b.

Moreover, accordingly, a space portion surrounded by the adjacent external connection terminals 730a on the first isolation trench 61a is formed. Hereinafter, a description will be made with the first isolation trench 61a and the space portion being collectively referred to as the trench portion 613a.

Next, a third substrate 10c is detachably joined on the external connection terminal 730a via a junction layer 30a (ST112).

Figure 11B:
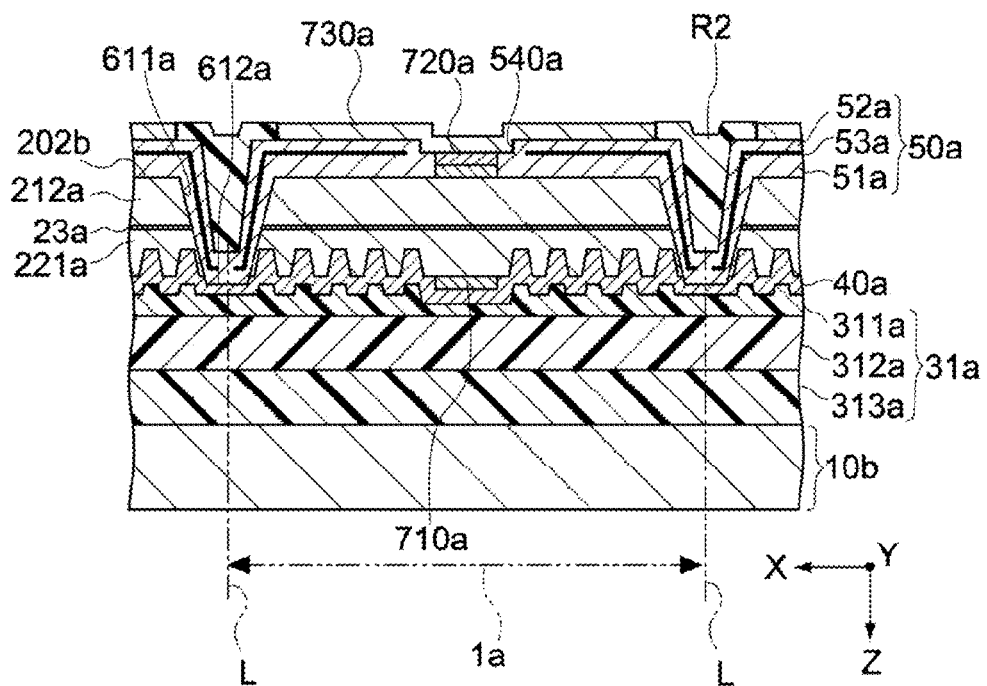

As shown in FIG. 11B, in this process, a resin R2 is filled in the trench portion 613a first. Accordingly, when the third substrate 10c is joined, it is possible to prevent a void from being generated due to the trench portion 613a, for example. The method of filling the resin R2 is not particularly limited, and an applying method, a spin coating method, spraying, or a dipping method can be appropriately adopted, for example. Furthermore, the resin R2 is etched back after the application. Thus, the resin R2 can be formed to have almost the same height as the surface of the external connection terminal 730a. The material of the resin R2 is not particularly limited.

Figure 12A:
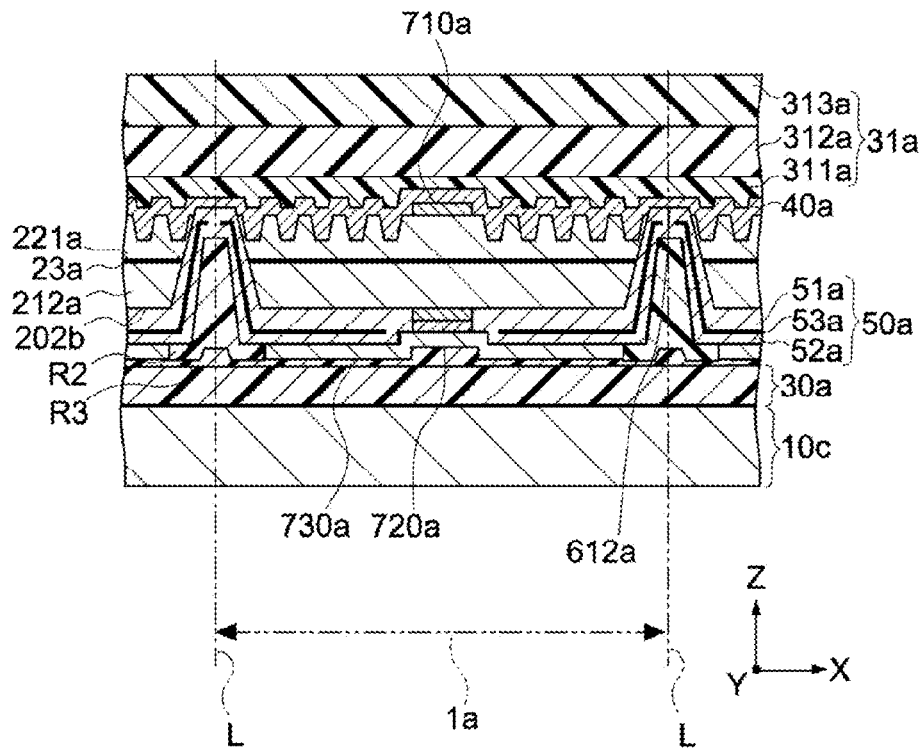
FIGS. 12A and 12B are each a cross-sectional view for explaining the method of producing the light-emitting element wafer.

Next, as shown in FIG. 12A, for example, an adhesive resin R3 is formed on the resin R2 and the external connection terminal 730a. Accordingly, it is possible to improve the adhesiveness between the junction layer 30a and the external connection terminal 730a. Moreover, the resin R3 corresponds to the resin film 732 described above. The method of forming the resin R3 is not particularly limited, and an applying method, a spin coating method, spraying, or a dipping method can be appropriately adopted, for example. It should be noted that FIG. 12A shows the state vertically inverted from the state shown in FIG. 11B.

Then, on the external connection terminal 730a and the resin R3, the third substrate 10c on which the junction layer 30a is formed is joined. The third substrate 10c corresponds to the supporting substrate 10, and is a disk-shaped semiconductor wafer including sapphire or the like.

An applying method, a spin coating method, spraying, a dipping method or the like is appropriately adopted to form the junction layer 30a on the third substrate 10c. The junction layer 30a may include a thermosetting resin material having adhesiveness such as polyimide. In this case, any material that is capable of absorbing a laser light having a predetermined wavelength and causing ablation can be used similarly to the second resin film 313a.

It should be noted that the method of joining the third substrate 10c is not limited to the above-mentioned method. For example, at least any one of the resin R2 and the resin R3 does not need to be formed. Alternatively, the junction layer 30a does not necessarily need to be formed on the third substrate 10c, and may be formed on the external connection terminal 730a (the resin R2 and the resin R3).

Figure 12B:
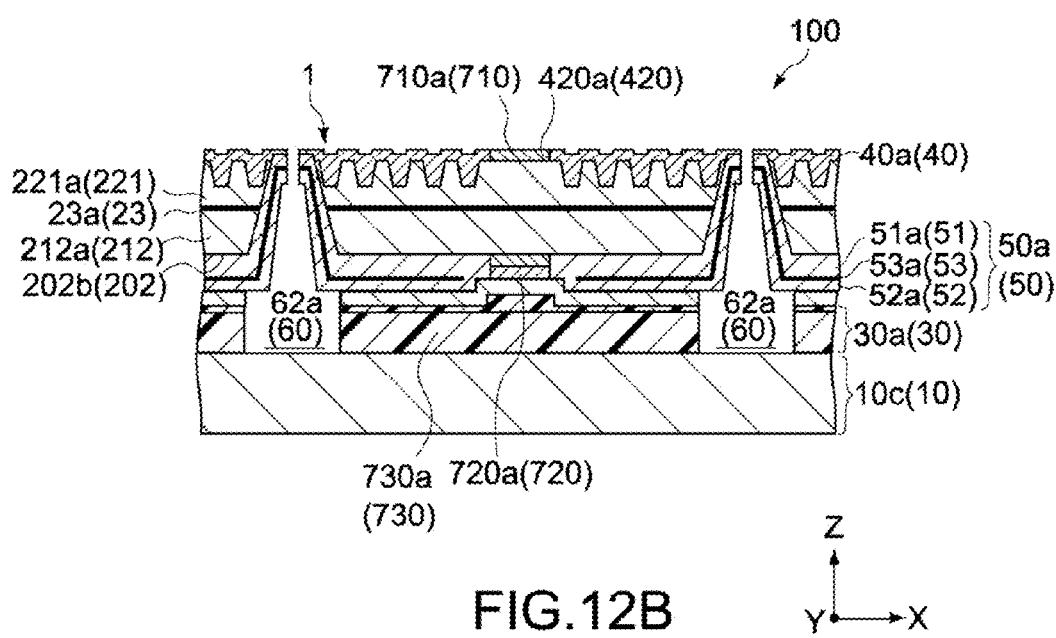

Next, with reference to FIGS. 12A and 12B, the second substrate 10b is removed to expose the first inorganic film 40a (ST113). The second substrate 10b is irradiated with a laser light having a predetermined wavelength from above the second substrate 10b, for example, and the second resin film 313a is ablated when being heated to evaporation. As a result, the second substrate 10b is removed by the power of the ablation. Accordingly, as shown in FIG. 12A, the second substrate 10b is removed on the interface between the second substrate 10b and the second resin film 313a. By using such a method of laser ablation, the second substrate 10b can be easily removed.

After that, the second resin film 313a, the adhesive layer 312a, and the first resin film 311a can be removed by a wet etching method, a dry etching method, or the like. Accordingly, the entire temporal junction layer 31a is removed, and thus, it is possible to expose the first inorganic film 40a as shown in FIG. 12B.

It should be noted that after the first inorganic film 40a is exposed, the first inorganic film 40a on the first electrode 710a can be removed to from a connection hole 420a. In this process, a resist (not shown) on which the pattern of the shape corresponding to the first electrode 710a is formed is formed first, and a dry etching method or the like via the resist is used similarly to the connection hole 540a.

Subsequently, with reference to FIG. 12B, the first inorganic film 40a that has left on the bottom surface 612a of the first isolation trench 61a is etched to form a second isolation trench 62a that isolates the first inorganic film 40a for each element 1a (ST114). In this process, a dry etching method such as an RIE method or a wet etching method is used to form the second isolation trench 62a.

In this process, the first inorganic film 40a in an area that faces the bottom surface 612a of the first isolation trench 61a is etched first. Next, an area of the second inorganic film 50a, which is formed in the bottom surface 612a, is etched similarly. Then, the resin R2, the resin R3, and the junction layer 30a formed in the area that faces the bottom surface 612a are also etched isotropically. Accordingly, the second isolation trench 62a having a depth from the first inorganic film 40a to the third substrate 10c is formed. The second isolation trench 62a corresponds to the isolation trench portion 60 of the light emitting elements 1. It should be noted that the above-mentioned etching of the components may be performed under the same conditions or different conditions.

It should be noted that in this embodiment, the metal layer 53a includes the second opening 532a in the area thereof that faces the bottom surface 612a, and only the first and second insulating layers 51a and 52a exist in the area. Accordingly, the area of the reflection film 50a can be easily etched. Moreover, the resin R3 and the junction layer 30a are etched using the external connection terminal 730a as a mask. Therefore, it is possible to leave only the resin R3 and the junction layer 30a that exist in the area facing the external connection terminal 730a as they are.

In this process, the junction layer 30 on the third substrate 10c (supporting substrate 10), the external connection terminal 730, the luminescent layer 20 covered by the reflection film 50, and the first inorganic film 40 are isolated for each element 1, and thus, the light-emitting element wafer 100 is formed.

In the light emitting element 1 according to this embodiment, the first inorganic film 40a is formed on the first surface 201a of the luminescent layer 20a, and the reflection film 50a, the external connection terminal 730a, and the junction layer 30a are formed on the second surface 202b opposite the first surface 201a. Specifically, crystal growth of the luminescent layer 20a is caused with a uniform thickness in the plane, and the light emitting element 1 has a configuration in which the layers are laminated on the luminescent layer 20a. Thus, the elements 1 in the wafer plane can be formed to have a uniform thickness. Accordingly, variation in the thicknesses of the elements 1 in the wafer plane can be suppressed to 10% or less, for example.

Moreover, the first concavo-convex structure 210a of the luminescent layer 20a is formed right after the crystal growth of the luminescent layer 20a is caused. Accordingly, it is possible to form the first concavo-convex structure 210a in a desires shape accurately. Therefore, it is possible to increase the output efficiency, and to control the orientation of light.

Furthermore, because the first inorganic film 40*a* functions as an etching stop layer in the process of forming the first isolation trench 61*a* by a dry etching method or the like, it is possible to form the first isolation trench 61*a* to have a uniform depth in the plane. Specifically, the first inorganic film 40*a* can be configured to be exposed to the bottom surface 612*a* of the first isolation trench 61*a*. Accordingly, the first inorganic film 40 and the reflection film 50 can be connected and the second end portion 510 of the reflection film 50 and the first end portion 41 of the first inorganic film 40 can be laminated after the elements 1 are formed. Therefore, the elements 1 can be formed to have a uniform shape, and variation in the heights of the plurality of light emitting elements 1 on the light-emitting element wafer 100 from the surface 11 can be suppressed to 10% or less, for example.

Moreover, accordingly, there is no need to provide an etching stop layer for the luminescent layer 20*a* when the first isolation trench 61*a* is formed, which can contribute to the increase in the material selectivity of the luminescent layer and the simplification of the production process.

Furthermore, because a dry etching method is used, the area of a wafer is increased and an isolation trench can be formed in a uniform shape in the plane even if the isolation trench is formed to be narrow.

Moreover, in this embodiment, because the wall surface 611*a* of the first isolation trench 61*a* can be formed to be a tapered surface, the reflection film 50*a* can be easily formed. In particular, a resin material having low viscosity can be used for the first and second insulating layers 51*a* and 52*a*, and it is possible to easily form the first and second insulating layers 51*a* and 52*a* using a spin coating method or the like.

Furthermore, because the metal layer 53*a* can be accurately formed as described above, it is possible to expose the metal layer 53 to the end surface of the second end portion 510 after the element 1 is formed. Therefore, it is possible to increase the heat radiation property of the metal layer 53*a* and to reduce the flaws of the element 1. Moreover, because the metal layer 53 is capable of suppressing the side etching of the second end portion 510 when the second isolation trench 62*a* is formed, the second isolation trench 62*a* can be formed accurately.

The respective light emitting elements 1 on the light-emitting element wafer 100 formed in this way are mounted on a display apparatus (electronic apparatus) 80, for example.

Figure 15:
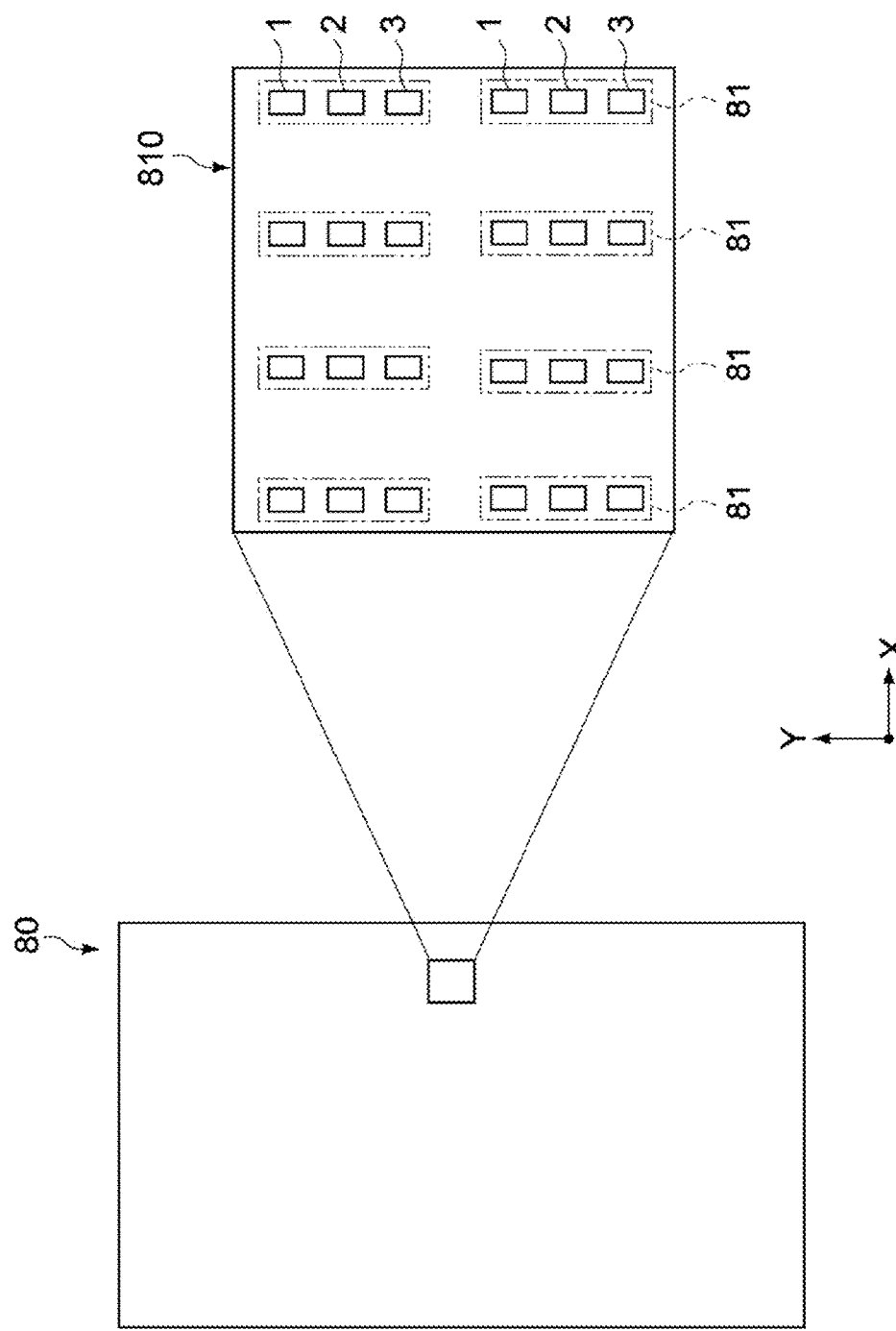
FIG. 15 is a schematic plan view of a display apparatus (electronic apparatus) using the light emitting element.

FIG. 15 is a schematic plan view of the display apparatus 80. Specifically, the light emitting element 1 that emits red light and light emitting elements 2 and 3 that emit blue light and green light constitute a light emitting element unit 81, and a light emitting element module on which a plurality of light emitting element units 81 are arranged is mounted on a substrate 810 of the display apparatus 80. Next, a method of producing the display apparatus 80 and a configuration example of the display apparatus 80 will be described. It should be noted that in the elements 1, 2, and 3 shown in FIG. 15, configurations such as resin that covers them, a wiring, and the like are not shown.

(Method of Producing Display Apparatus)

Figure 16:
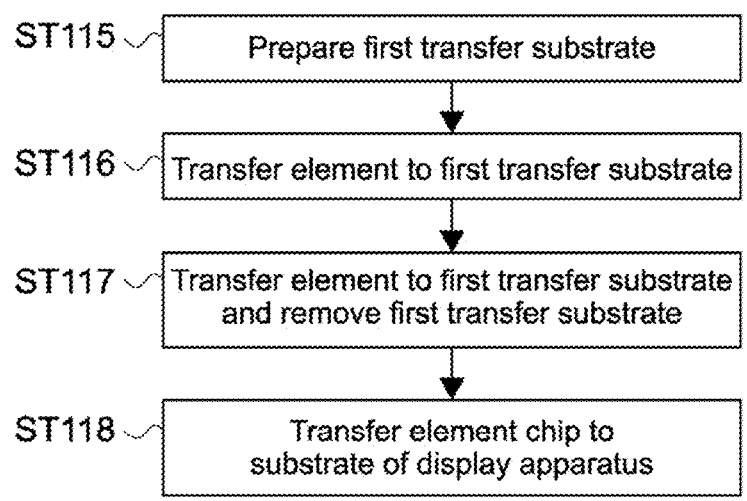
FIG. 16 is a flowchart of a method of producing the display apparatus.

FIG. 16 is a flowchart of a method of producing the display apparatus 80 according to this embodiment, FIG. 17 is a schematic plan view for explaining the production method, and FIG. 18 are each a schematic cross-sectional view for explaining the production method. To the processes shown in FIG. 16, reference numerals continued from ST114 shown in FIG. 6 are added. In FIG. 17, only 12 elements 1 are shown for description.

With reference to FIG. 17, the outline of the method of producing the display apparatus 80 will be described. The respective light emitting elements 1 on the light-emitting element wafer 100 are transferred to a first transfer substrate (transfer substrate) 910 first, and are arranged at predetermined intervals larger than the width of the isolation trench portion 60. Furthermore, the element 1 is transferred to a second transfer substrate 920 and is covered by the coating layer 922, and a wiring and the like (not shown) are formed. After that, the element 1 is transferred to the substrate 810 of the electronic apparatus 80 as a light emitting element chip 90 covered by the coating layer 922.

Figure 18A:
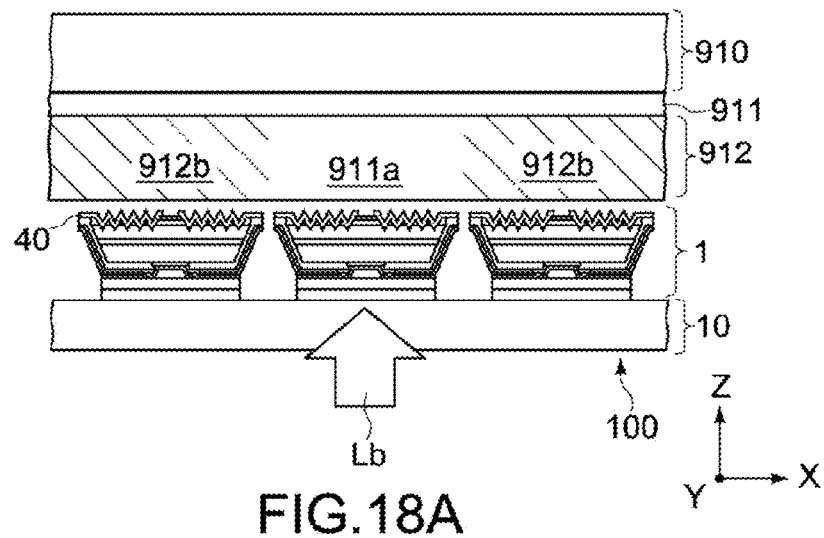
FIGS. 18A, 18B and 18C are each a schematic plan view for explaining the method of producing the display apparatus.

As shown in FIG. 18A, the first transfer substrate 910 arranged to face the first inorganic film 40 of the respective elements 1 of the light-emitting element wafer 100 is prepared first (ST115). The first transfer substrate 910 is formed to have a size such that the elements 1 can be arranged at predetermined intervals. The first transfer substrate 910 is formed of a glass substrate or a plastic substrate, for example.

On the transfer substrate 910, a first temporal junction layer 911 and an adhesive layer 912 are formed, for example. The first temporal junction layer 911 is formed on the transfer substrate 910, and may include fluorine resin, silicone resin, a water-soluble adhesive agent such as PVA, or polyimide, for example. Moreover, the adhesive layer 912 is formed on the first temporal junction layer 911, and may include an ultraviolet (UV) curable resin having adhesiveness, thermosetting resin, thermoplastic resin, or the like.

Moreover, the adhesive layer 912 may have an uncured area 912*a* and a cured area 912*b*. Specifically, because the light emitting element 1 to be transferred is aligned to face the uncured area 912*a*, the light emitting element 1 can be reliably transferred to the adhesive layer 912 in the later transfer process. Moreover, in the case where UV curable resin is used for the adhesive layer 912, for example, the cured area 912*b* can be formed by selectively applying ultraviolet rays only to the area corresponding to the cured area 912*b* to cure the area. Furthermore, in the uncured area 912*a*, a concave portion having the shape corresponding to the light emitting element 1 may be formed.

Figure 18B:
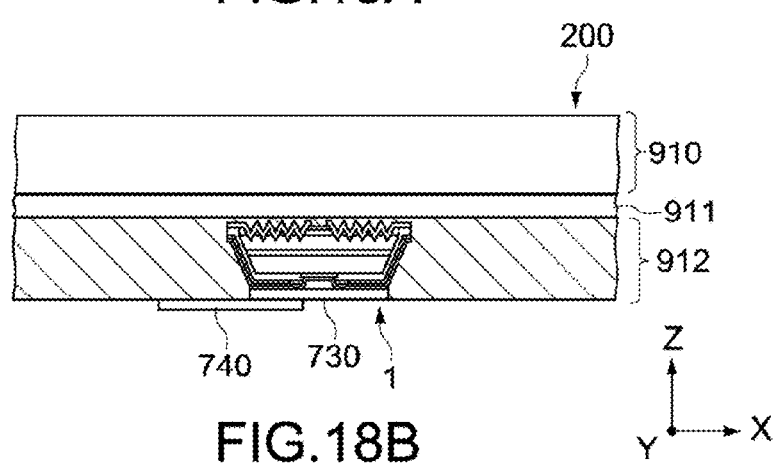

Next, with reference to FIGS. 18A and 18B, the external connection terminal 730 and the supporting substrate 10 are isolated by the laser ablation of the junction layer 30 from the side of the supporting substrate (third substrate) 10 of the light-emitting element wafer 100, and the respective elements 1 are transferred to the first transfer substrate (transfer substrate) 910 (ST116).

In this process, as shown in FIG. 18A, a laser light Lb is applied from the side of the supporting substrate 10 to the junction layer 30 of the light emitting element 1 to be transferred. As the laser, an excimer laser having a predetermined light emission wavelength or a harmonic YAG laser can be used, for example. Accordingly, the junction layer 30 is heated to be cured, the adhesiveness is lost, and a part of the resin evaporates, for example. Thus, the junction layer 30 and the external connection terminal 730 are explosively removed. Specifically, the entire element 1 is output in the Z-axis direction and is attached to the adhesive layer 912. Therefore, as shown in FIG. 18B, the light emitting element 1 is transferred to the adhesive layer 912 that faces the light emitting element 1.

Then, the uncured area 912*a* to which the light emitting element 1 is transferred is cured by the UV irradiation or the like. Accordingly, the light emitting elements 1 can be reliably joined to the adhesive layer 912. Furthermore, a wiring layer 740 may be formed on the external connection terminal 730 as necessary.

Moreover, in this process, a light-emitting element wafer 200 including the first transfer substrate (supporting substrate) 910 and the plurality of light emitting elements 1 can be formed. Specifically, by performing the process on the respective desired elements 1, the light-emitting element wafer 200 in which the plurality of light emitting elements 1 are arranged on the first transfer substrate 910 can be formed.

Figure 18C:
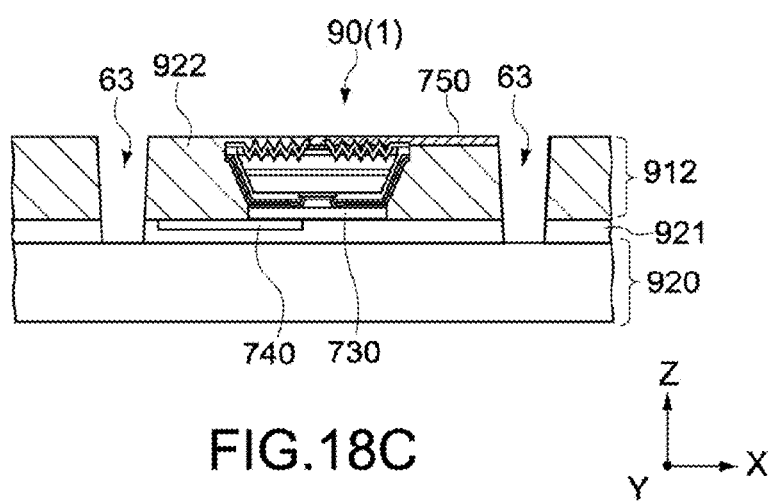

Next, with reference to FIG. 18C, the respective light emitting elements 1 are transferred to the second transfer substrate 920, and the first transfer substrate 910 is removed (ST117). The second transfer substrate 920 typically has almost the same size as the first transfer substrate 910, and a second temporal junction layer 921 including fluorine resin, silicone resin, a water-soluble adhesive agent such as PVA, polyimide, or the like is formed thereon. The external connection terminal 730 and the wiring layer 740 of the respective elements 1 joined to the first transfer substrate 910 are joined to the second temporal junction layer 921 first. Next, a laser light is applied from above the first transfer substrate 910 to the first temporal junction layer 911 of the first transfer substrate 910, and thus, the first temporal junction layer 911 and the adhesive layer 912 are isolated. Accordingly, the entire adhesive layer 912 in which the elements 1 are embedded is transferred to the second temporal junction layer 921.

Furthermore, as shown in FIG. 18C, a third isolation trench 63 may be formed in the adhesive layer 912 between the elements 1 to isolate adhesive layer 912 for each element 1. Accordingly, the coating layer 922 formed of the adhesive layer 912, which covers the element 1, is formed. Furthermore, a wiring layer 750 that is connected to the first electrode may be formed. Hereinafter, the light emitting element chip 90 having a configuration in which the elements 1 and the coating layer 922 covering the elements 1 are included will be described. Specifically, the light emitting element chip 90 includes the elements 1, the coating layer 922, and the wiring layers 740 and 750.

Then, each light emitting element chip 90 is transferred to the substrate 810 of the display apparatus 80 (ST118). As the transfer method, the above-mentioned laser ablation may be adopted, for example, or an adsorption holder or the like may be used to perform the transfer mechanically. The substrate 810 is formed of a wiring substrate on which a predetermined drive circuit (not shown) is formed.

Moreover, as shown in FIG. 17, the light emitting element chips 90 are arranged on the substrate 810 at predetermined pitches along the X-axis direction and the Y-axis direction. The predetermined pitch is three times or more of the length of the light emitting element chip 90 along the X-axis direction and the Y-axis direction. Accordingly, the light emitting element module 81 can be formed by arranging a light emitting element chip including the light emitting element 2 that emits blue light and a light emitting element chip including the light emitting element 3 that emits green light between the light emitting element chips 90 including the light emitting elements 1 that emit red light. Moreover, because the light emitting element chips are arranged in space, a wiring or the like can be formed using the space.

In this way, the display apparatus 80 shown in FIG. 15 is formed. Specifically, the display apparatus 80 includes the substrate 810 on which a drive circuit is formed, the plurality of light emitting elements 1 that emit red light, the plurality of light emitting elements 2 that emit blue light, the plurality of light emitting elements 3 that emit green light, and the plurality of light emitting elements 1, 2, and 3 are arranged on the substrate 810.

It should be noted that in addition to the process, still another transfer substrate may be used to perform the transfer. Specifically, after the process of transferring to the second transfer substrate 920, a process of transferring to a third transfer substrate and a process of transferring to a fourth transfer substrate may be performed. Accordingly, the respective elements 1 can be transferred at larger intervals, which is advantageous for the formation of a wiring layer or the production of a display apparatus with a larger area.

It should be noted that in this embodiment, because the metal layer 53 of the reflection film 50 is exposed to the second end portion 510, the metal layer 53 is not exposed to the first inorganic film 40. Specifically, even if the wiring layer 750 that is extracted from the first electrode 710 to the first inorganic film 40 is formed, two insulating layers of the first inorganic film 40 and the first insulating layer 51 are sandwiched between the metal layer 53 and the wiring layer 750. Accordingly, it is possible to suppress short-circuiting between the metal layer 53 and the wiring layer 750, and to reduce the flaws of the element 1.

Moreover, as described above, in this embodiment, it is possible to form the second isolation trench 62a accurately in the step of ST114. Specifically, it is possible to suppress the side etching of the junction layer 30a etched by using the external connection terminal 730 as a mask, and to prevent the position of the center of gravity of the junction layer 30a and the luminescent layer 20a in the XY plane from being displaced. Therefore, it is possible to suppress the positional displacement due to the output of the element 1 obliquely to the Z-axis direction or the falling of the element 1 due to the rotation during the output when the laser ablation is performed for each element 1 in the step of ST116, for example. Therefore, it is possible to transfer the element to a desired position.

(Second Embodiment)

Figure 19:
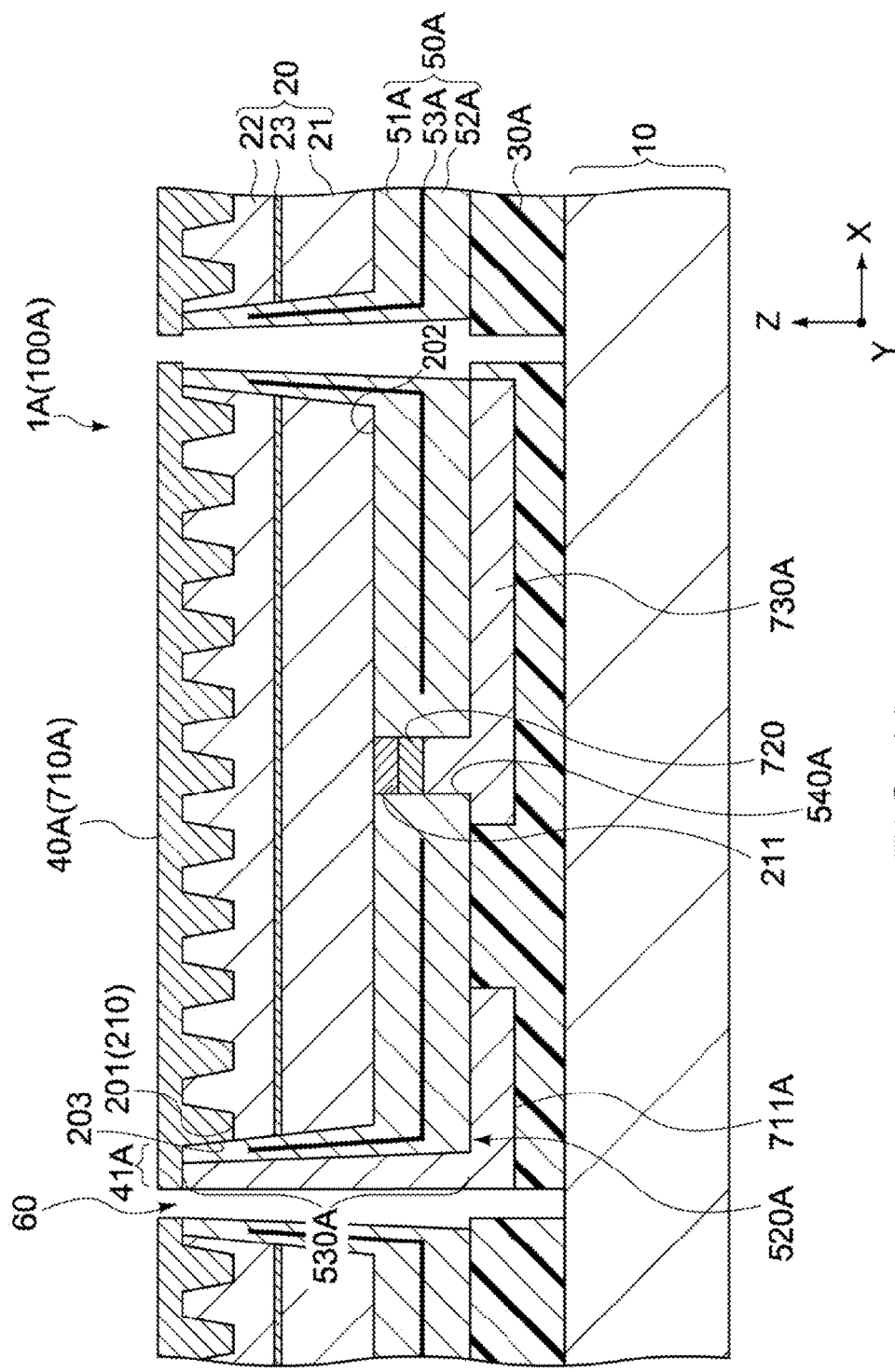
FIG. 19 is a schematic cross-sectional view of a light-emitting element wafer according to a second embodiment of the present disclosure.

FIG. 19 is a cross-sectional view of a main portion showing the configuration of a light-emitting element wafer according to a second embodiment of the present disclosure. In FIG. 19, the same components as those according to the first embodiment will be denoted by the same reference symbols and a description thereof will be omitted.

A light emitting element 1A of a light-emitting element wafer 100A according to this embodiment is different from the light emitting element 1 in that a first inorganic film 40A functions also as a first electrode 710A. Accordingly, the entire first surface 201a serves as a light extraction surface, and thus, it is possible to improve the output efficiency of light emitted from the luminescent layer 20.

The first inorganic film 40A serves also as a first electrode 710A including a transparent conductive material, and includes a transparent conductive material such as ITO. Accordingly, it is possible to ensure the conductivity while maintaining the translucency of the first inorganic film 40A. The first inorganic film 40A may have a first end portion 41A formed on the peripheral portion similarly to the first embodiment, and a second concavo-convex portion (not shown) formed taking an example from the first concavo-convex portion 210.

The light emitting element 1A may further include an extraction electrode 711A. The extraction electrode 711A is connected to the first inorganic film 40A serving as the first electrode 710A, and is capable of extracting the first electrode 710A to the side of the second surface 202. Specifically, the extraction electrode 711A is connected to the first electrode 710A on the side of the first surface 201, and is formed to above the second surface 202 (second inorganic film 520) via the peripheral surface 203 (third inorganic film 530) of the luminescent layer 20. The material of the extraction electrode 711A is not particularly limited, and the extraction electrode 711A includes a metal material such as Al, Au, and Ti, or an alloy or laminated body containing them.

Moreover, the reflection film 50a may have no second end portion. Accordingly, the extraction electrode 711A can be connected to the first inorganic film 40A (first electrode 710A) via the first end portion 41A.

An external connection terminal 730A is connected to the second electrode 720 via the connection hole 540A. In this embodiment, the external connection terminal 730A may be extended from the area located immediately below the second electrode 720 to the isolation trench portion 60 in one direction, for example. Accordingly, it is possible to prevent the external connection terminal 730A from being brought into contact with the extraction electrode 711A, and to prevent the problem such as short-circuiting from occurring.

In the light emitting element 1A having such a configuration, the first electrode 710A including a transparent conductive material is connected to the extraction electrode 711A including a metal material. Accordingly, it is possible to reduce the change in the connection resistance between them, and to improve the process margin. Moreover, the connection resistance between the first electrode 710A and the second semiconductor layer 22 can be reduced, and also the driving voltage can be reduced.

FIGS. 20 to 23 are each a schematic cross-sectional view for explaining a method of producing a light-emitting element wafer 1A. In the method of producing the light-emitting element wafer 1A according to this embodiment, the process of forming the first electrode (ST103) and the process of forming the first inorganic film (ST104) of the processes in the method of producing the light-emitting element wafer 1 can be performed simultaneously. Other processes will be denoted by the same reference symbols as those shown in the flowchart of FIG. 6, and components different from those according to the first embodiment will be mainly described.

Figure 20A:
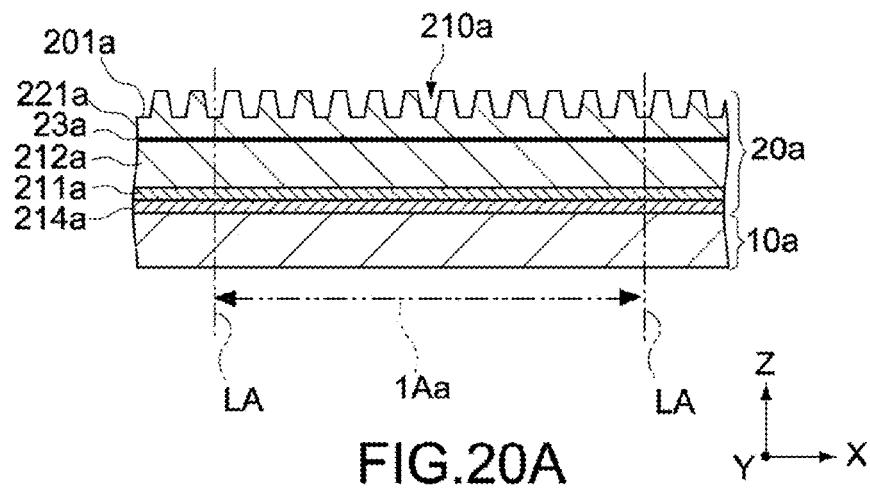
FIGS. 20A, 20B and 20C are each a schematic cross-sectional view for explaining the method of producing the light-emitting element wafer.

First, a metal organic chemical vapor deposition (MOCVD) method is used to form the luminescent layer 20a on the first substrate 10a (ST101) similarly to the first embodiment. Next, as shown in FIG. 20A, the first concavo-convex structure 210a is formed on the first surface 201a by, for example, a dry etching method (ST102). In this embodiment, because the first concavo-convex structure 210a can be formed on the entire first surface 201a, a mask may be formed or a mask does not need to be formed when the first concavo-convex structure 210a is formed. Moreover, the method of forming the first concavo-convex structure 210a is not limited to a dry etching method or the like, and oxygen ions, blast processing, or the like may be used to rough the first surface 201a.

Figure 20B:
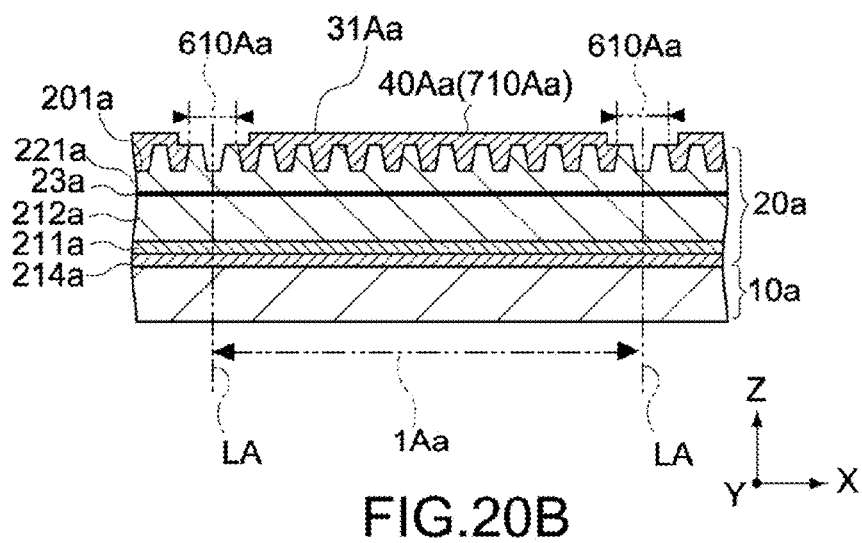

Next, as shown in FIG. 20B, a first inorganic film 40Aa serving as a first electrode 710Aa is formed on the first surface 201a (ST103 and ST104). The first inorganic film 40Aa includes, for example, a transparent conductive material such as ITO, and is formed by a sputtering method or the like.

Then, by a lift-off method using a mask, a boundary area 610Aa of the first inorganic film 40Aa between element areas 1Aa can be removed, and the first inorganic film 40Aa can be pattern-formed in the shape shown in FIG. 20B.

Figure 20C:
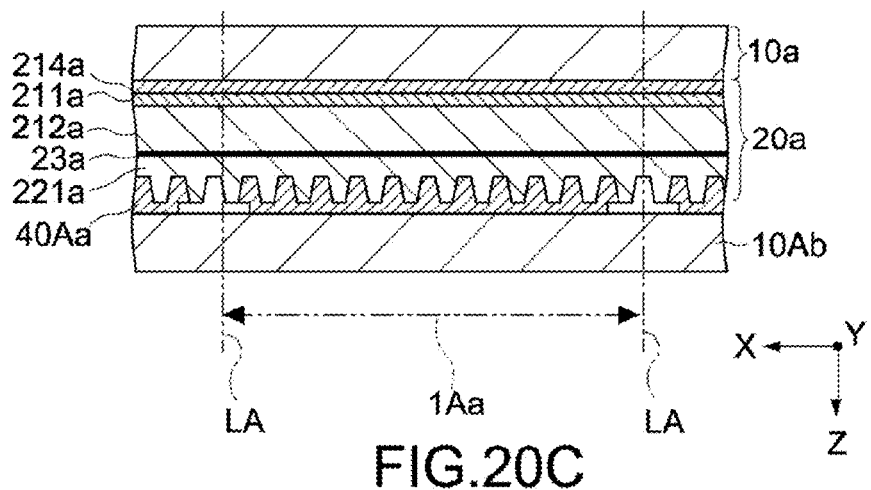

Next, as shown in FIG. 20C, a second substrate 10Ab is joined to the first inorganic film 40Aa (ST105). The second substrate 10Ab may be formed of a sapphire ($Al_2O_3$) substrate, a silicon (Si) substrate, a quartz substrate, or a glass substrate, for example. Accordingly, the surface of the second substrate 10Ab is activated by plasma, and the second substrate 10Ab can be directly joined to the first inorganic film 40Aa by a method such as anodic bonding and room-temperature bonding. Moreover, the second substrate 10Ab can be joined to the first inorganic film 40A via a temporal junction layer such as a resin film similarly to the first embodiment. It should be noted that FIG. 20C shows the state vertically inverted from the state shown in FIG. 20B so that the first substrate 10a is arranged on the upper side of FIG. 20C.

Figure 21A:
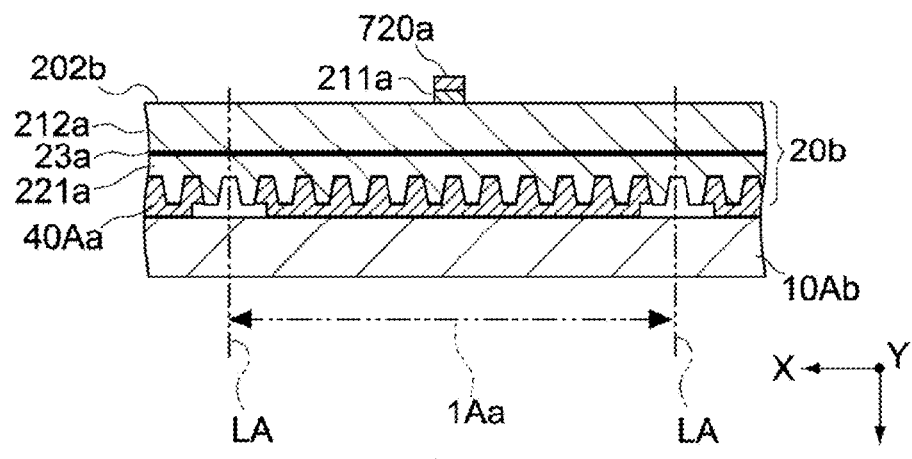
FIGS. 21A, 21B and 21C are each a schematic cross-sectional view for explaining the method of producing the light-emitting element wafer.

Next, as shown in FIG. 21A, the first substrate 10a is removed to expose the second surface 202a of the luminescent layer 20a, which is opposite to the first surface 201a (ST106) similarly to the first embodiment. Next, on the second surface 202a, the second electrode 720a is formed (ST107). Moreover, the second electrode 720a is used as a mask to etch the first contact layer 211a.

Figure 21B:
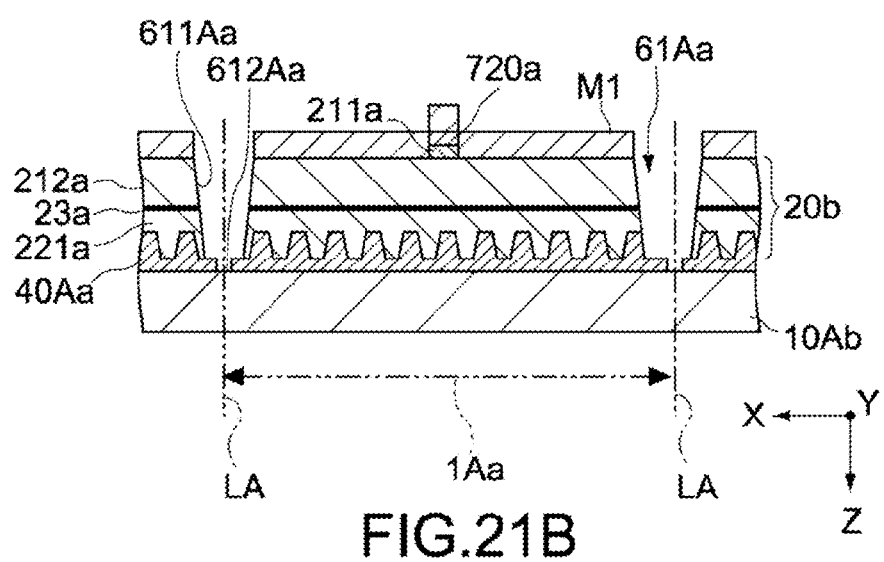

Next, as shown in FIG. 21B, the luminescent layer 20a is etched from the second surface 202b using the second substrate 10Ab as an etching stop layer, and a first isolation trench 61Aa that isolates the luminescent layer 20a for each element (element area) 1Aa is formed (ST108). In this process, an etchant having a high etch selectivity ratio with the material of the second substrate 10Ab and the luminescent layer 20a is used to perform a dry etching after the mask M1 is formed similarly to the first embodiment, and thus, a first isolation trench 61Ab can be formed to have a uniform depth in the wafer plane. Accordingly, the second substrate 10Ab is exposed to a bottom surface 612Aa of the first isolation trench 61Aa. Furthermore, the mask M1 is removed after the first isolation trench 61Aa is formed.

Alternatively, similarly to the first embodiment, the first isolation trench 61Aa may be formed using the first inorganic film 40Aa as an etching stop layer. In this case, an etchant having a high etch selectivity ratio with the first inorganic film 40Aa and the luminescent layer 20a can be used to perform a dry etching.

Figure 21C:
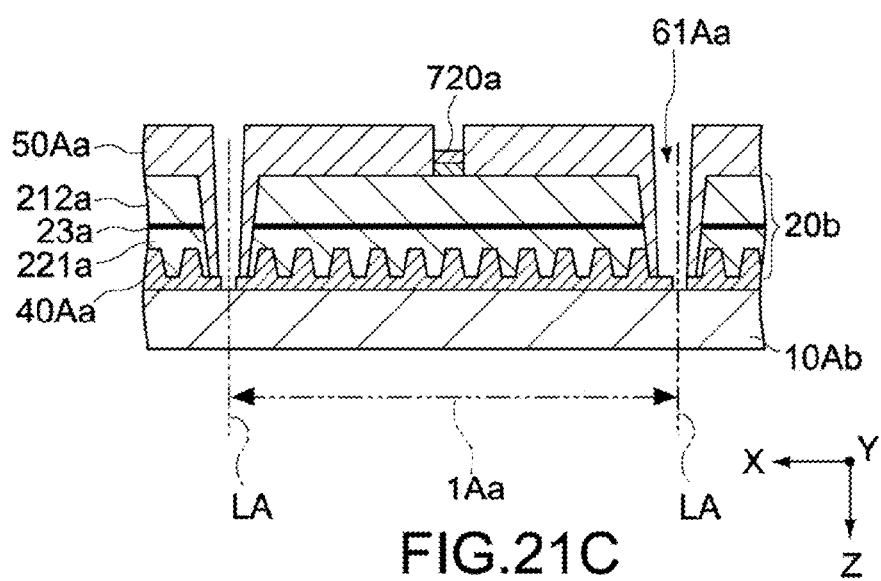

Next, as shown in FIG. 21C, similarly to the first embodiment, a reflection film (second inorganic film) 50Aa that covers a wall surface 611Aa and the bottom surface 612Aa of the first isolation trench 61Aa and the second surface 202b is formed (ST109). Although not shown in FIGS. 21C to 23B, the reflection film 50Aa has a laminate structure of a first insulating layer 51Aa, a metal layer 53Aa, and a second insulating layer 52Aa, which are formed in the stated order, as described above. Then, as shown in FIG. 21C, a part of the reflection film 50Aa is removed to expose the second electrode 720a (ST110).

Figure 22A:
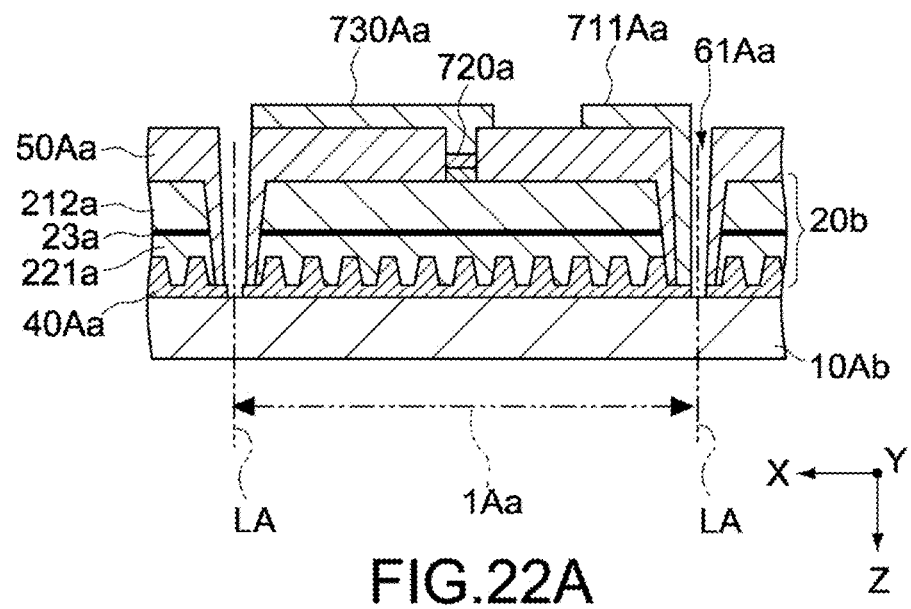
FIGS. 22A and 22B are each a schematic cross-sectional view for explaining the method of producing the light-emitting element wafer.

Next, as shown in FIG. 22A, on the second surface 202b, an external connection terminal 730Aa that is electrically connected to the second electrode 720a is formed (ST111). In this embodiment, in this process, an extraction electrode 711Aa that is electrically connected to the first electrode 710Aa (first inorganic film 40Aa) is formed. An appropriate method such as a sputtering method, a deposition method, an ion plating method, and a plating method is used to form a metal film having a predetermined pattern on the reflection film 50Aa, similarly to the first embodiment, thereby forming the external connection terminal 730Aa and the extraction electrode 711Aa.

Figure 22B:
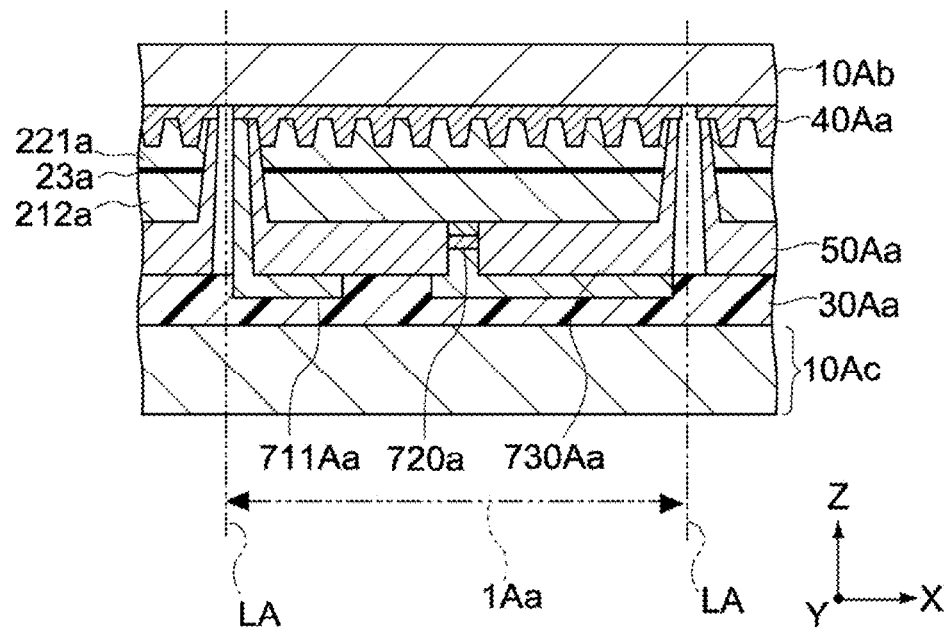

Next, with reference to FIG. 22B, on the external connection terminal 730Aa and the extraction electrode 711Aa, a third substrate 10Ac is detachably joined via a junction layer 30Aa (ST112). The junction layer 30Aa may include resin having adhesiveness such as polyimide, or resin that is capable of absorbing a laser light having a predetermined wavelength, similarly to the first embodiment. Moreover, the third substrate 10Ac may be formed of a sapphire substrate, for example.

Figure 23A:
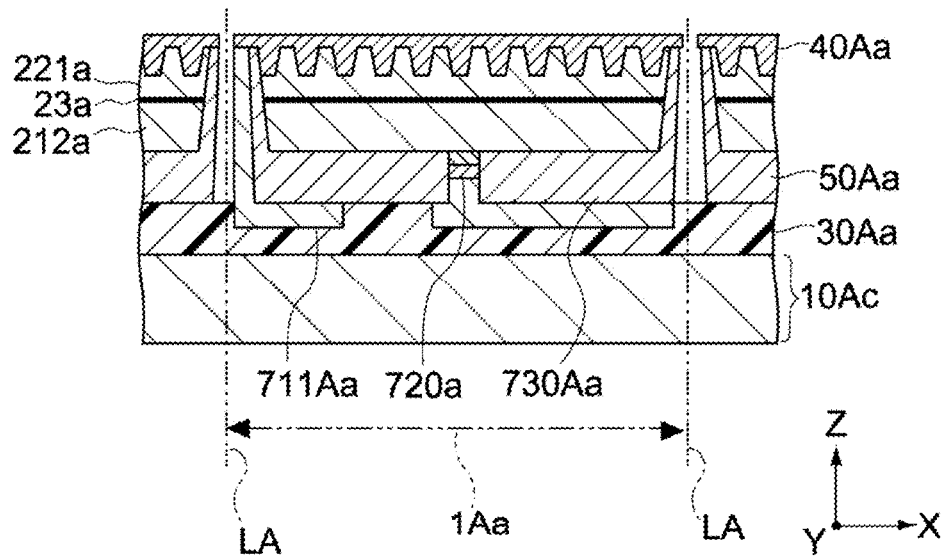
FIGS. 23A and 23B are each a schematic cross-sectional view for explaining the method of producing the light-emitting element wafer.

Next, as shown in FIG. 23A, the second substrate 10Ab is removed to expose the first inorganic film 40Aa (ST113). In this process, the second substrate 10Ab can be removed by a dry etching method, a wet etching method, laser ablation in the case of bonding using resin that is capable of absorbing a laser light having a predetermined wavelength, or the like.

Figure 23B:
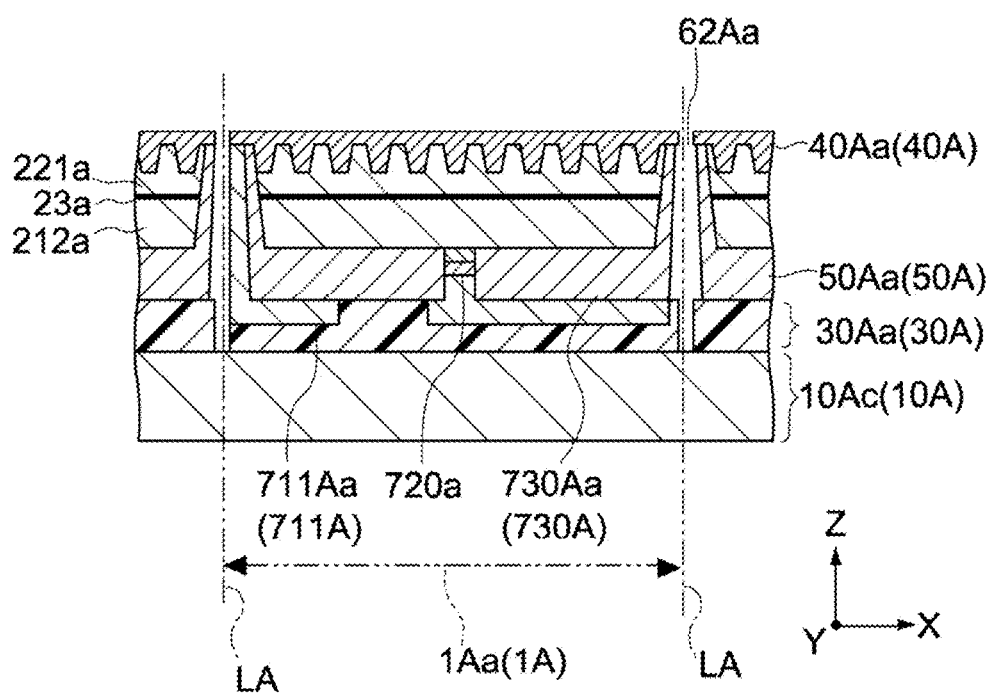

Then, as shown in FIG. 23B, the junction layer 30Aa between elements 1Aa is isolated to form a second isolation trench 62Aa (ST114). In this process, a part of the junction layer 30Aa can be removed by a dry etching method or the like. Alternatively, a wet etching method, a laser process, or the like can be used to remove the junction layer 30Aa. Moreover, because the first inorganic film 40Aa includes a transparent conductive material such as ITO, the junction layer 30Aa can be etched using the first inorganic film 40Aa as a mask. Accordingly, there is no need to perform the process of forming a mask separately.

By the above-mentioned processes, the light-emitting element wafer 100A according to this embodiment is formed. In this embodiment, the second substrate 10Ab can be joined without a temporal junction layer. Moreover, in the process of forming the first concavo-convex structure 210a (ST102), the process of isolating for each element 1A (ST115), or the like, a mask does not need to be formed. Therefore, it is possible to reduce the number of processes, and thus, it is advantageous from a viewpoint of the productivity and cost.

Although embodiments of the present disclosure have been described, the embodiments of the present disclosure are not limited to the above-mentioned embodiments and various modifications can be made without departing from the gist of the present technology.

For example, in the embodiments, the luminescent layer has been described to emit red light. However, the luminescent layer is not limited thereto, and may emit blue light or green light, for example. For example, in the case where the luminescent layer emits blue light, a GaN material or the like can be used as the material of the semiconductor, for example.

Furthermore, in the embodiments, the light emitting element has been described to be an LED. However, the light emitting element may include a semiconductor laser or the like. Moreover, the electronic apparatus is not limited to a display apparatus, and may be a lighting apparatus such as a car tail lamp, an inspection apparatus on which an LED or a semiconductor laser is mounted, a pickup apparatus that is capable of writing to or reading an optical disc, or the like.

Moreover, in the first embodiment, the metal layer is exposed from the end surface of the second end portion. However, the metal layer is not limited thereto, and does not need to be exposed. In this case, in the process of forming the metal layer (ST109-2), with reference to FIG. 13B, by forming the resist to have almost the same width (length along the width direction between the wall surfaces of the first isolation trench) as the width of the bottom surface, the second end portion does not need to be formed.

Moreover, although the peripheral surface has been described to have a tapered surface, the peripheral surface does not limited thereto, and may be perpendicular to the first and second surfaces, for example.

Furthermore, the reflection film does not have a laminated structure, and may have only one layer. In this case, the reflection film may include an insulating material having a desired reflectance with respect to output light, for example. Moreover, the reflection film may have a two-layered structure of an insulating layer and a metal layer, and the metal layer may be formed as an extraction electrode of the first electrode similarly to the extraction electrode according to the second embodiment.

Moreover, in the first embodiment, the second substrate 10b has been described to be joined via the temporal junction layer 31a. However, the second substrate 10b may be joined without the temporal junction layer 31a similarly to the second embodiment.

It should be noted that the present disclosure may also take the following configurations.

(1) A light-emitting element wafer, including:

a supporting substrate;

a luminescent layer that is formed of a semiconductor and has a first surface and a second surface, the first surface including a first electrode, the second surface including a second electrode, the second surface being arranged between the supporting substrate and the first surface;

a junction layer that joins luminescent layer to the supporting substrate and is arranged between the supporting substrate and the second surface;

a first inorganic film formed on the first surface;

a second inorganic film formed between the junction layer and the second surface;

an isolation trench portion that isolates elements and is formed to have a depth such that the isolation trench portion extends from the first inorganic film to the supporting substrate; and a third inorganic film that connects the first inorganic film and the second inorganic film.

(2) The light-emitting element wafer according to (1), in which the first inorganic film has a first end portion formed in parallel with the first surface, the first end portion projecting to the isolation trench portion, and the third inorganic film has a second end portion that takes an example from the first end portion to project to the isolation trench portion.

(3) The light-emitting element wafer according to (2), in which the second inorganic film and the third inorganic film include a first insulating layer, a metal layer, and a second insulating layer, and are formed sequentially, the first insulating layer being formed adjacent to the luminescent layer, the metal layer being formed on the first insulating layer, the second insulating layer being formed on the metal layer.

(4) The light-emitting element wafer according to any one of (1) to (3), in which the luminescent layer has a first concavo-convex portion formed on the first surface, and the first inorganic film has a second concavo-convex portion formed taking an example from the first concavo-convex portion.

(5) The light-emitting element wafer according to any one of (1) to (4), in which the luminescent layer emits red light.

(6) The light-emitting element wafer according to (5), in which
the semiconductor includes at least any one of materials of an AsP compound semiconductor, an AlGaInP compound semiconductor, and a GaAs compound semiconductor.

(7) The light-emitting element wafer according to any one of (1) to (6), in which
the first inorganic film is the first electrode including a transparent conductive material.

(8) A light emitting element, including:
a luminescent layer that is formed of a semiconductor and has a first surface, a second surface, and a peripheral surface, the first surface including a first electrode, the second surface including a second electrode and being opposite to the first surface, the peripheral surface connecting the first surface and the second surface;
a first inorganic film formed on the first surface;
a second inorganic film formed on the second surface; and
a third inorganic film that is formed to cover the peripheral surface and connects the first inorganic film and the second inorganic film.

(9) An electronic apparatus, including:
a substrate on which a drive circuit is formed; and
at least one first semiconductor light-emitting element that is provided on the substrate and includes
a luminescent layer that is formed of a semiconductor and has a first surface, a second surface, and a peripheral surface, the first surface including a first electrode connected to the drive circuit, the second surface including a second electrode, the second surface being disposed between the substrate and the first surface, the second electrode being connected to the drive circuit, the peripheral surface connecting the first surface and the second surface,
a first inorganic film formed on the first surface,
a second inorganic film formed between the luminescent layer and the second surface,
a third inorganic film that is formed to cover that peripheral surface and connects the first inorganic film and the second inorganic film.

(10) The electronic apparatus according to (9), further including:
a plurality of second semiconductor light-emitting elements configured to emit blue light; and
a plurality of third semiconductor light-emitting elements configured to emit green light, in which
the at least one first semiconductor light-emitting element includes a plurality of first semiconductor light-emitting element configured to emit red light, and the plurality of first, second, and third semiconductor light-emitting elements are arranged on the substrate.

(11) A method of producing a light-emitting element wafer, including:
forming a luminescent layer having a laminated structure in which a semiconductor is laminated on a first substrate;
forming a first inorganic film on a first surface of the luminescent layer;
removing the first substrate to expose a second surface of the luminescent layer, the second surface being opposite to the first surface;
etching the luminescent layer from the second surface with the first inorganic film being an etching stop layer to form a first isolation trench that isolates the luminescent layer for each element; and
forming a second inorganic film that covers the second surface and a wall surface and a bottom surface of the first isolation trench.

(12) The method of producing a light-emitting element wafer according to (11), in which
the forming of the first isolation trench includes etching the luminescent layer by a dry etching method.

(13) The method of producing a light-emitting element wafer according to (12), in which
the forming of the first isolation trench includes forming the first isolation trench so that a cross-sectional area of the luminescent layer for each element is gradually increased from the second surface to the first surface.

(14) The method of producing a light-emitting element wafer according to any one of (11) to (13), in which
the forming of the second inorganic film includes
forming a first insulating layer on the second surface and the wall surface and the bottom surface of the first isolation trench,
forming a metal layer on the first insulating layer, and
forming a second insulating layer on the metal layer.

(15) The method of producing a light-emitting element wafer according to any one of (11) to (14), further including
forming a first concavo-convex structure on the first surface before the forming of the first inorganic film and after the forming of the luminescent layer.

(16) The method of producing a light-emitting element wafer according to (15), in which
the forming of the first inorganic film includes taking an example from the first concavo-convex structure to form a second concavo-convex structure.

(17) The method of producing a light-emitting element wafer according to (11) to (16), further including
detachably joining the second substrate to the first inorganic film via a tentative a tentative junction layer before the exposure of the second surface and after the forming of the first inorganic film.

(18) The method of producing a light-emitting element wafer according to (17), further including:
forming an electrode for each device on the second surface before the forming of the first isolation trench after the exposure of the second surface;
removing a part of the second inorganic film to expose the electrode after the forming of the second inorganic film;
forming an external connection terminal that is electrically connected to the electrode on the second surface; and
detachably joining a third substrate to the external connection terminal via the junction layer.

(19) The method of producing a light-emitting element wafer according to (18), further including:
removing the second substrate to expose the first inorganic film; and
etching the first inorganic film remained on the bottom surface of the first isolation trench to form a second isolation trench that isolates the first inorganic film for each element, after the joining of the third substrate.

(20) The method of producing a light-emitting element wafer according to (19), further including:
preparing a transfer substrate arranged to face the first inorganic film; and
isolating the external connection terminal from the third substrate by laser ablation of the junction layer to transfer each element on the transfer substrate, after the forming of the second isolation trench.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting element wafer, comprising:
    a supporting substrate; and
    a plurality of light emitting elements on the supporting substrate,
    wherein,
        (1) each light emitting element comprises
            (a) a luminescent layer that has a first surface and a second surface, the first surface including a light extraction area, the second surface being between the supporting substrate and the first surface, the luminescent layer comprising an active layer between two cladding lavers, the active layer comprising a semiconductor;
            (b) a first electrode at the first surface and a second electrode at the second surface;
            (c) a junction layer that joins the luminescent layer to the supporting substrate and is between the supporting substrate and the second surface;
            (d) a first inorganic film on the first surface;
            (e) a second inorganic film between the junction layer and the second surface, the second inorganic film having a connection hole that provides connection access to the second electrode, the second electrode being within the connection hole;
            (f) a third inorganic film that connects the first inorganic film and the second inorganic film; and
            (g) a conductive connection layer between the junction layer and the second inorganic film, the conductive connection layer being connected to the second electrode,
        (2) the second and third inorganic films comprise a laminate structure include a metal layer and serve as a reflective film, and
        (3) the light emitting elements are isolated from each other by a trench that extends from the first organic films to the supporting substrate.

2. The light-emitting element wafer according to claim 1, wherein:
    the first inorganic film has a first end portion formed in parallel with the first surface, the first end portion projecting to the isolation trench portion, and
    the third inorganic film has a second end portion that corresponds to the first end portion to project to the isolation trench portion.

3. The light-emitting element wafer according to claim 2, wherein the second inorganic film and the third inorganic film include a first insulating layer, the metal layer, and a second insulating layer such that the first insulating layer is adjacent to the luminescent layer and between the luminescent layer and the metal layer, the metal layer is between the first insulating layer and the second insulating layer, and the second insulating layer is between the metal layer and the junction layer.

4. The light-emitting element wafer according to claim 1, wherein:
    the luminescent layer has a first concavo-convex portion on the first surface, and
    the first inorganic film has a second concavo-convex portion that corresponds to the first concavo-convex portion.

5. The light-emitting element wafer according to claim 1, wherein the luminescent layer emits red light.

6. The light-emitting element wafer according to claim 5, wherein the semiconductor includes at least one material selected from a group consisting of an AsP compound semiconductor, an AlGaInP compound semiconductor, and a GaAs compound semiconductor.

7. The light-emitting element wafer according to claim 1, wherein the first inorganic film and the first electrode are transparent.

8. A light emitting element, comprising:
    a luminescent layer that has a first surface, a second surface, and a peripheral surface, the first surface including a light extraction area, the second surface being opposite to the first surface, the peripheral surface connecting the first surface and the second surface, the luminescent layer comprising an active layer between two cladding layers, the active layer comprising a semiconductor;
    a first electrode at the first surface and a second electrode at the second surface;
    a first inorganic film on the first surface;
    a second inorganic film on the second surface, the second inorganic film having a connection hole that provides connection access to the second electrode, the second electrode being within the connection hole;
    a third inorganic film that covers the peripheral surface and connects the first inorganic film and the second inorganic film;
    a conductive connection layer between the junction layer and the second inorganic film, the conductive connection layer being connected to the second electrode,
    wherein,
        the second and third inorganic films comprise a laminate structure include a metal layer and serve as a reflective film.

9. An electronic apparatus, comprising:
    a substrate with a drive circuit; and
    at least one first semiconductor light-emitting element configured to emit red light and that is on the substrate and includes
        (a) a luminescent layer that has a first surface, a second surface, and a peripheral surface, the first surface including a light extraction area, the second surface being between the substrate and the first surface, the second electrode being connected to the drive circuit, the peripheral surface connecting the first surface and the second surface, the luminescent layer comprising an active layer between two cladding lavers, the active layer comprising a semiconductor,
        (b) a first electrode at the first surface and connected to the drive circuit,
        (c) a second electrode at the second surface,
        (d) a first inorganic film on the first surface,
        (e) a second inorganic film at the second surface, the luminescent layer being between the first and second inorganic films, the second inorganic film having a connection hole that provides connection access to the second electrode, the second electrode being within the connection hole,
        (f) a third inorganic film that covers the peripheral surface and connects the first inorganic film and the second inorganic film,
        (g) a junction layer joining the light emitting element to the substrate, and
        (h) a conductive connection layer between the junction layer and the second inorganic film, the conductive connection layer being connected to the second electrode.

10. The electronic apparatus according to claim 9, further comprising:
  a plurality of second semiconductor light-emitting elements configured to emit blue light; and
  a plurality of third semiconductor light-emitting elements configured to emit green light,
  wherein,
    the at least one first semiconductor light-emitting element includes a plurality of first semiconductor light-emitting element configured to emit red light, and
    the plurality of first, second, and third semiconductor light-emitting elements are arranged on the substrate.

* * * * *